(12) United States Patent  
Choi et al.

(10) Patent No.: US 9,279,177 B2  
(45) Date of Patent: Mar. 8, 2016

(54) THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

(75) Inventors: Yong-Sup Choi, Yongin (KR); Myeng-Woo Nam, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 441 days.

(21) Appl. No.: 13/157,220

(22) Filed: Jun. 9, 2011

(65) Prior Publication Data

US 2012/0009706 A1    Jan. 12, 2012

(30) Foreign Application Priority Data

Jul. 7, 2010    (KR) .................. 10-2010-0065465

(51) Int. Cl.
*H01L 33/00* (2010.01)
*B05C 11/10* (2006.01)
(Continued)

(52) U.S. Cl.
CPC .............. *C23C 14/044* (2013.01); *C23C 14/24* (2013.01); *C23C 14/50* (2013.01); *C23C 14/544* (2013.01); *C23C 14/56* (2013.01)

(58) Field of Classification Search
CPC .... H01L 29/66742; H01L 31/18; H01L 51/56
USPC ..................................................... 438/34–84
See application file for complete search history.

(56) References Cited

U.S. PATENT DOCUMENTS

| 4,416,217 A | 11/1983 | Nakamura et al. |
| 4,468,648 A | 8/1984 | Uchikune |

(Continued)

FOREIGN PATENT DOCUMENTS

| CN | 1476279 A | 2/2004 |
| CN | 1489419 A | 4/2004 |

(Continued)

OTHER PUBLICATIONS

KIPO Office action dated Jan. 6, 2012, for Korean Patent application 10-2010-0000897, 4 pages.

(Continued)

*Primary Examiner* — Marc Armand
*Assistant Examiner* — Quinton Brasfield
(74) *Attorney, Agent, or Firm* — Lewis Roca Rothgerber Christie LLP

(57) ABSTRACT

A thin film deposition apparatus includes: a deposition source for discharging a deposition material; a deposition source nozzle unit disposed at a side of the deposition source and including a plurality of deposition source nozzles arranged in a first direction; a patterning slit sheet disposed opposite to the deposition source nozzle unit and having a plurality of patterning slits arranged in the first direction; a barrier plate assembly including a plurality of barrier plates that are disposed between the deposition source nozzle unit and the patterning slit sheet in the first direction, the plurality of barrier plates partitioning a deposition space between the deposition source nozzle unit and the patterning slit sheet into a plurality of sub-deposition spaces; and a capacitive vacuum gauge disposed at a side of the deposition source and configured to measure a pressure inside the deposition source.

5 Claims, 11 Drawing Sheets

(51) Int. Cl.
*C23C 14/04* (2006.01)
*C23C 14/24* (2006.01)
*C23C 14/50* (2006.01)
*C23C 14/54* (2006.01)
*C23C 14/56* (2006.01)

(56) References Cited

U.S. PATENT DOCUMENTS

| | | |
|---|---|---|
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,909,995 A | 6/1999 | Wolf et al. |
| 6,091,195 A | 7/2000 | Forrest et al. |
| 6,099,649 A | 8/2000 | Schmitt et al. |
| 6,222,198 B1 | 4/2001 | Brown |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 * | 4/2007 | Fujii ................ H01L 27/3267 313/506 |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 8,673,077 B2 | 3/2014 | Sonoda et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0028349 A1 | 2/2004 | Nagasaka et al. |
| 2004/0029028 A1 | 2/2004 | Shimizu |
| 2004/0056244 A1 | 3/2004 | Marcus et al. |
| 2004/0062856 A1 | 4/2004 | Marcus et al. |
| 2004/0086639 A1 | 5/2004 | Grantham et al. |
| 2004/0096771 A1 | 5/2004 | Kashiwagi et al. |
| 2004/0115338 A1 * | 6/2004 | Yoneda ........................ 427/66 |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hira |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0118788 A1 | 6/2005 | Kuwahara et al. |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2005/0280356 A1 | 12/2005 | Murayama et al. |
| 2006/0011136 A1 | 1/2006 | Yamazaki et al. |
| 2006/0012280 A1 | 1/2006 | Kang et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0103289 A1 | 5/2006 | Kim et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigen et al. |
| 2007/0009552 A1 | 1/2007 | Whitehead et al. |
| 2007/0009652 A1 | 1/2007 | Manz et al. |

(56) References Cited

U.S. PATENT DOCUMENTS

| | | |
|---|---|---|
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0137568 A1 | 6/2007 | Schreiber |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1* | 8/2007 | Ukigaya ............... C23C 14/044 438/758 |
| 2007/0195844 A1 | 8/2007 | Ma et al. |
| 2007/0231460 A1 | 10/2007 | Ukigaya |
| 2007/0235157 A1 | 10/2007 | Bunker et al. |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1* | 6/2008 | Boroson ............... C23C 14/042 427/66 |
| 2008/0145521 A1 | 6/2008 | Guo et al. |
| 2008/0174235 A1 | 7/2008 | Kim et al. |
| 2008/0176414 A1* | 7/2008 | Im ..................... G03F 7/70041 438/795 |
| 2008/0202421 A1 | 8/2008 | Allen et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0290791 A1* | 11/2008 | Lee et al. ........................ 313/504 |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0000854 A1* | 1/2010 | Goto ................... C23C 14/3492 427/294 |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0192856 A1 | 8/2010 | Sung et al. |
| 2010/0196607 A1 | 8/2010 | Carlson et al. |
| 2010/0248416 A1* | 9/2010 | Priddy et al. ..................... 438/84 |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0316801 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0139069 A1 | 6/2011 | Ahn et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0220022 A1 | 9/2011 | Hong et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |

(56) References Cited

U.S. PATENT DOCUMENTS

| | | | |
|---|---|---|---|
| 2014/0110680 | A1 | 4/2014 | Choe |
| 2014/0131667 | A1 | 5/2014 | Chang |

FOREIGN PATENT DOCUMENTS

| | | | |
|---|---|---|---|
| CN | 1500904 | A | 6/2004 |
| CN | 1556872 | A | 12/2004 |
| CN | 1607868 | A | 4/2005 |
| CN | 1682569 | A | 10/2005 |
| CN | 1704501 | A | 12/2005 |
| CN | 1716102 | A | 1/2006 |
| CN | 1814854 | A | 8/2006 |
| CN | 1841696 | A | 10/2006 |
| EP | 1 413 644 | A2 | 4/2004 |
| EP | 1 418 250 | | 5/2004 |
| EP | 1 518 940 | A1 | 3/2005 |
| EP | 2354270 | A1 | 8/2011 |
| JP | 57-194252 | A2 | 11/1982 |
| JP | 2-247372 | | 10/1990 |
| JP | 04-272170 | | 9/1992 |
| JP | 5-22405 | U1 | 3/1993 |
| JP | 05-098425 | | 4/1993 |
| JP | 5-230628 | A2 | 9/1993 |
| JP | 8-27568 | A2 | 1/1996 |
| JP | 9-95776 | A2 | 4/1997 |
| JP | 10-50478 | | 2/1998 |
| JP | 10-120171 | | 5/1998 |
| JP | 10-270535 | | 10/1998 |
| JP | 11-144865 | | 5/1999 |
| JP | 2000-068054 | | 3/2000 |
| JP | 2000-282219 | | 10/2000 |
| JP | 2000-323277 | | 11/2000 |
| JP | 2001-28325 | A2 | 1/2001 |
| JP | 2001-052862 | | 2/2001 |
| JP | 2001-093667 | | 4/2001 |
| JP | 2002-75638 | A2 | 3/2002 |
| JP | 2002-175878 | | 6/2002 |
| JP | 2002-348659 | A2 | 12/2002 |
| JP | 2003-003250 | | 1/2003 |
| JP | 2003-077662 | | 3/2003 |
| JP | 2003-157973 | | 5/2003 |
| JP | 2003-197531 | A2 | 7/2003 |
| JP | 2003-297562 | | 10/2003 |
| JP | 2003-321767 | A2 | 11/2003 |
| JP | 2003-347394 | A2 | 12/2003 |
| JP | 2004-035964 | A2 | 2/2004 |
| JP | 2004-043898 | | 2/2004 |
| JP | 2004-76150 | A2 | 3/2004 |
| JP | 2004-091858 | | 3/2004 |
| JP | 2004-103269 | | 4/2004 |
| JP | 2004-103341 | | 4/2004 |
| JP | 2004-107764 | | 4/2004 |
| JP | 2004-137583 | A2 | 5/2004 |
| JP | 2004-143521 | A2 | 5/2004 |
| JP | 2004-169169 | A2 | 6/2004 |
| JP | 2004-199919 | | 7/2004 |
| JP | 2004-342455 | A2 | 12/2004 |
| JP | 2004-349101 | | 12/2004 |
| JP | 2004-355975 | | 12/2004 |
| JP | 2005-044592 | | 2/2005 |
| JP | 2005-101505 | | 4/2005 |
| JP | 2005-122980 | A2 | 5/2005 |
| JP | 2005-163099 | | 6/2005 |
| JP | 2005-165015 | A2 | 6/2005 |
| JP | 2005-174843 | A2 | 6/2005 |
| JP | 2005-206939 | A2 | 8/2005 |
| JP | 2005-213616 | A2 | 8/2005 |
| JP | 2005-235568 | | 9/2005 |
| JP | 2005-293968 | | 10/2005 |
| JP | 2005-296737 | | 10/2005 |
| JP | 2006-28583 | A2 | 2/2006 |
| JP | 2006-172930 | A2 | 6/2006 |
| JP | 2006-176809 | A2 | 7/2006 |
| JP | 2006-210038 | A2 | 8/2006 |
| JP | 2006-219760 | | 8/2006 |
| JP | 2006-275433 | | 10/2006 |
| JP | 2006-292955 | A2 | 10/2006 |
| JP | 2006-307247 | A2 | 11/2006 |
| JP | 2007-047293 | | 2/2007 |
| JP | 2007-66862 | | 3/2007 |
| JP | 2007-146219 | | 6/2007 |
| JP | 2007-157886 | | 6/2007 |
| JP | 2007-186740 | A2 | 7/2007 |
| JP | 2007-242436 | | 9/2007 |
| JP | 2007-291506 | A2 | 11/2007 |
| JP | 2008-19477 | A2 | 1/2008 |
| JP | 2008-108628 | A2 | 5/2008 |
| JP | 2008-121098 | | 5/2008 |
| JP | 2008-521165 | A2 | 6/2008 |
| JP | 2008-156686 | | 7/2008 |
| JP | 2008-196003 | | 8/2008 |
| JP | 2008-248301 | A2 | 10/2008 |
| JP | 2008-274373 | | 11/2008 |
| JP | 2008-300056 | | 12/2008 |
| JP | 2009-019243 | | 1/2009 |
| JP | 2009-24208 | A2 | 2/2009 |
| JP | 2009-049223 | | 3/2009 |
| JP | 2009-81165 | A2 | 4/2009 |
| JP | 2009-87910 | | 4/2009 |
| JP | 2009-117231 | A2 | 5/2009 |
| JP | 2009-520110 | | 5/2009 |
| JP | 2010-159167 | A2 | 7/2010 |
| JP | 2010-261081 | A2 | 11/2010 |
| JP | 2011-47035 | | 3/2011 |
| JP | 2011-146377 | | 7/2011 |
| JP | 2012-92448 | | 5/2012 |
| JP | 2012-211352 | | 11/2012 |
| JP | 2004-225058 | | 8/2014 |
| KR | 1997-0008709 | A | 2/1997 |
| KR | 10-0257219 | B1 | 2/2000 |
| KR | 10-2000-0019254 | | 4/2000 |
| KR | 10-2000-0023929 | | 5/2000 |
| KR | 2001-0024652 | A | 3/2001 |
| KR | 2001-0030175 | A | 4/2001 |
| KR | 10-2001-0039298 | A | 5/2001 |
| KR | 10-2001-0059939 | | 7/2001 |
| KR | 10-2001-0092914 | A | 10/2001 |
| KR | 2001-0093666 | A | 10/2001 |
| KR | 20-0257218 | Y1 | 12/2001 |
| KR | 10-2002-0000201 | | 1/2002 |
| KR | 2002-0001555 | A | 1/2002 |
| KR | 2002-0025760 | | 4/2002 |
| KR | 10-2002-0050922 | | 6/2002 |
| KR | 2002-0088662 | A | 11/2002 |
| KR | 10-2002-0090934 | | 12/2002 |
| KR | 10-2002-0091457 | A | 12/2002 |
| KR | 2003-0001745 | A | 1/2003 |
| KR | 2003-0034730 | A | 5/2003 |
| KR | 10-2003-0043012 | A | 6/2003 |
| KR | 2003-0046090 | A | 6/2003 |
| KR | 2003-0069684 | A | 8/2003 |
| KR | 10-0405080 | B1 | 11/2003 |
| KR | 10-0406059 | B1 | 11/2003 |
| KR | 10-2003-0091947 | | 12/2003 |
| KR | 10-2003-0093959 | | 12/2003 |
| KR | 2003-0094033 | A | 12/2003 |
| KR | 10-2004-0014258 | A | 2/2004 |
| KR | 20-0342433 | Y | 2/2004 |
| KR | 10-2004-0034537 | | 4/2004 |
| KR | 10-2004-0039910 | A | 5/2004 |
| KR | 10-0430336 | B1 | 5/2004 |
| KR | 10-2004-0050045 | | 6/2004 |
| KR | 10-2004-0069281 | | 8/2004 |
| KR | 10-2004-0084747 | | 10/2004 |
| KR | 10-2004-0087142 | A | 10/2004 |
| KR | 10-2004-0110718 | | 12/2004 |
| KR | 10-0463212 | B1 | 12/2004 |
| KR | 10-2005-0018234 | | 2/2005 |
| KR | 10-2005-0024324 | A | 3/2005 |
| KR | 10-2005-0028943 | | 3/2005 |
| KR | 10-2005-0039140 | | 4/2005 |
| KR | 10-0483487 | B1 | 4/2005 |
| KR | 10-2005-0062853 | A | 6/2005 |

(56) References Cited

FOREIGN PATENT DOCUMENTS

| | | |
|---|---|---|
| KR | 10-2005-0082644 A | 8/2005 |
| KR | 10-0520159 B1 | 10/2005 |
| KR | 10-0532657 B1 | 12/2005 |
| KR | 10-2006-0008602 | 1/2006 |
| KR | 10-2006-0018745 | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 | 7/2006 |
| KR | 10-2006-0083510 | 7/2006 |
| KR | 10-2006-0092387 A | 8/2006 |
| KR | 10-2006-0098755 A | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109561 | 10/2006 |
| KR | 10-2006-0109627 | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 B1 | 11/2006 |
| KR | 10-2006-0123944 A | 12/2006 |
| KR | 10-0687007 B1 | 2/2007 |
| KR | 10-0696547 B1 | 3/2007 |
| KR | 10-0696550 B1 | 3/2007 |
| KR | 10-0697663 B1 | 3/2007 |
| KR | 10-0698033 B1 | 3/2007 |
| KR | 10-0700466 B1 | 3/2007 |
| KR | 10-2007-0035796 | 4/2007 |
| KR | 10-2007-0037848 A | 4/2007 |
| KR | 10-0711885 B1 | 4/2007 |
| KR | 10-2007-0050793 | 5/2007 |
| KR | 10-2007-0050793 A | 5/2007 |
| KR | 10-0723627 B1 | 5/2007 |
| KR | 10-2007-0056190 A | 6/2007 |
| KR | 10-0726132 B1 | 6/2007 |
| KR | 10-0736218 B1 | 7/2007 |
| KR | 10-0739309 B1 | 7/2007 |
| KR | 10-0741142 B1 | 7/2007 |
| KR | 10-2007-0078713 | 8/2007 |
| KR | 10-2007-0080635 | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 | 10/2007 |
| KR | 10-2007-0101842 | 10/2007 |
| KR | 10-2007-0105595 | 10/2007 |
| KR | 10-0768212 B1 | 10/2007 |
| KR | 10-0770653 B1 | 10/2007 |
| KR | 10-2007-0112668 A | 11/2007 |
| KR | 10-2007-0114094 | 11/2007 |
| KR | 10-0787457 B1 | 12/2007 |
| KR | 10-2008-0001184 | 1/2008 |
| KR | 10-2008-0003720 | 1/2008 |
| KR | 10-2008-0007896 | 1/2008 |
| KR | 10-2008-0009285 A | 1/2008 |
| KR | 10-0797787 B1 | 1/2008 |
| KR | 10-0800125 B1 | 1/2008 |
| KR | 10-2008-0036983 A | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 | 5/2008 |
| KR | 10-2008-0046761 A | 5/2008 |
| KR | 10-0827760 B1 | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 B1 | 6/2008 |
| KR | 10-2008-0060400 | 7/2008 |
| KR | 10-2008-0061132 | 7/2008 |
| KR | 10-2008-0061666 A | 7/2008 |
| KR | 10-2008-0061774 A | 7/2008 |
| KR | 10-2008-0062212 | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 | 4/2009 |
| KR | 10-2009-0040618 A | 4/2009 |
| KR | 10-2009-0047953 | 5/2009 |
| KR | 10-2009-0052155 A | 5/2009 |
| KR | 10-2009-0052828 | 5/2009 |
| KR | 10-2009-0053417 A | 5/2009 |
| KR | 10-0899279 B1 | 5/2009 |
| KR | 10-2009-0066996 A | 6/2009 |
| KR | 10-2009-0075887 A | 7/2009 |
| KR | 10-2009-0079765 A | 7/2009 |
| KR | 10-2009-0081717 A | 7/2009 |
| KR | 10-0908232 B1 | 7/2009 |
| KR | 10-2009-0093161 A | 9/2009 |
| KR | 10-2009-0094911 A | 9/2009 |
| KR | 10-2009-0097453 | 9/2009 |
| KR | 10-2009-0107702 | 10/2009 |
| KR | 10-0922763 B1 | 10/2009 |
| KR | 10-2010-0000128 A | 1/2010 |
| KR | 10-2010-0000129 A | 1/2010 |
| KR | 10-2010-0002381 A | 1/2010 |
| KR | 10-2010-0026655 A | 3/2010 |
| KR | 10-2010-0038088 A | 4/2010 |
| KR | 10-2010-0044606 A | 4/2010 |
| KR | 10-2010-0047796 | 5/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 | 12/2010 |
| KR | 10-2010-0128589 A | 12/2010 |
| KR | 10-2010-0130786 | 12/2010 |
| KR | 10-2010-0133678 | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 | 3/2011 |
| KR | 10-2011-0032589 A | 3/2011 |
| KR | 10-2011-0082418 | 7/2011 |
| KR | 10-2011-0101767 A | 9/2011 |
| KR | 10-2011-0110525 A | 10/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | 9925894 A1 | 5/1999 |
| WO | 03043067 A1 | 5/2003 |

(56) References Cited

FOREIGN PATENT DOCUMENTS

| WO | WO2004016406 A1 | 2/2004 |
|---|---|---|
| WO | 2008004792 A1 | 1/2008 |

OTHER PUBLICATIONS

Korean Patent Abstracts for Publication No. 1020040043360, dated May 24, 2004, corresponding to KR Patent 10-0532657.
KIPO Office Action dated Mar. 21, 2012, for Korean priority Patent application 10-2010-0065465, (5 pages).
KIPO Office Action dated Apr. 4, 2012, for Korean Patent application 10-2009-0112796, (5 pages).
Patent Abstracts of Japan, and English machine translation of Japanese Publication 2001-052862, 20 pages.
Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080.
Korean Patent Abstracts, Publication No. 1020020088662, dated Nov. 29, 2002, for corresponding Korean Patent 10-0463212.
Korean Patent Abstracts, Publication No. 1020050045619, dated May 17, 2005, for corresponding Korean Patent 10-0520159.
Korean Patent Abstracts, Publication No. 1020040062203, dated Jul. 7, 2002, for corresponding Korean Patent 10-0646160.
Korean Patent Abstracts, Publication No. 1020060101987, dated Sep. 27, 2006, for corresponding Korean Patent 10-0687007.
Korean Patent Abstracts, Publication No. 1020020056238, dated Jul. 10, 2002, for corresponding Korean Patent 10-0698033.
Korean Patent Abstracts, Publication No. 1020050078637, datedugust 5, 2005, for corresponding Korean Patent 10-0700466.
Korean Patent Abstracts, Publication No. 1020070025164, dated Mar. 8, 2007, for corresponding Korean Patent 10-0711885.
Korean Patent Abstracts, Publication No. 1020020034272, dated May 9, 2002, for corresponding Korean Patent 10-0726132.
Korean Patent Abstracts, Publication No. 1020060126267, dated Dec. 6, 2006, for corresponding Korean Patent 10-0797787.
English Abstract, Publication No. 1020080002189, dated Jan. 4, 2008, for corresponding Korean Patent 10-0800125.
Korean Patent Abstracts, Publication No. 1020010062735, dated Jul. 7, 2001, for corresponding Korean Patent 10-0827760.
Korean Patent Abstracts, Publication No. 1020080038650, dated May 7, 2008, for corresponding Korean Patent 10-0839380.
SIPO Office action dated Oct. 30, 2012 for corresponding Chinese Patent application 200710007945.6, with English translation, (10 pages).
U.S. Office action dated May 16, 2013, for cross reference U.S. Appl. No. 13/235,337, (28 pages).
U.S. Office action dated Apr. 29, 2013, for cross reference U.S. Appl. No. 12/820,355, (31 pages).
English machine translation of Japanese Publication 2004-107764, dated Apr. 8, 2004, 10 pages).
Patent Abstracts of Japan, and English machine translation of Japanese Publication 2004-349101 dated Dec. 9, 2004, (11 pages).
U.S. Office action dated Aug. 21, 2013 issued in cross-reference U.S. Appl. No. 12/820,355 (14 pages).
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Aug. 24, 2012, issued to KR 10-2010-0066993 (5 pages).
KIPO Notice of Allowance dated Jul. 20, 2012, issued to KR 10-2010-0003545 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, ( 5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Nov. 25, 2011, issued to KR 10-2010-0014277 (5 pages).
KIPO Notice of Allowance, dated Sep. 1, 2012, issued to KR 10-2010-0014276 (5 pages).
KIPO Notice of Allowance, dated Sep. 28, 2011, issued to KR 10-2009-0052357 (5 pages).
KIPO Office action dated Apr. 2, 2012, issued to KR 10-2010-0066993 (4 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0011196 (4 pages).
KIPO Office action dated Feb. 1, 2012, issued to KR 10-2010-0013848 (4 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 13, 2012 to KR 10-2009-0056529 (5 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Sep. 1, 2012, issued to KR 10-2010-0010136 (5 pages).

(56) References Cited

OTHER PUBLICATIONS

KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
Korean Registration Certificate dated Sep. 28, 2011 for Korean Application No. 10-2009-0045200 (5 pages).
SIPO Certificate of Patent dated Aug. 14, 2013, for Chinese application 201010266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).
U.S. Notice of Allowance dated Jun. 30, 2014, issued to U.S. Appl. No. 12/907,396 (40 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 2, 2013, issued to U.S. Appl. No. 13/157,220 (33 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office action dated Jun. 17, 2014, issued to U.S. Appl. No. 13/157,220 (36 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office action dated May 6, 2014, issued to U.S. Appl. No. 13/467,998 (21 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 25, 2013, for U.S. Appl. No. 13/031,756, (34 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20 pages).

(56) References Cited

OTHER PUBLICATIONS

US Office action dated Sep. 12, 2012, in U.S. Appl. No. 12/815,673 (26 pages).
JPO Office action dated Jan. 20, 2015 for corresponding Japanese Patent application 2011-118686 (5 pages).
SIPO Office action dated Apr. 3, 2015, corresponding to Chinese Patent application 201210008397.X, (7 pages).
SIPO Office action dated Feb. 2, 2015, for corresponding Chinese Patent application 201110199594.X (12 pages).
U.S. Notice of Allowance dated Oct. 28, 2014, issued to U.S. Appl. No. 13/014,225 (64 pages).
U.S. Office action dated Dec. 31, 2014 issued to U.S. Appl. No. 12/873,556, (72 pages).
U.S. Office action dated Dec. 31, 2014 issued to U.S. Appl. No. 13/469,029 (74 pages).
U.S. Office action dated Nov. 14, 2014, issued to U.S. Appl. No. 13/178,472 (10 pages).
U.S. Office action dated Sep. 26, 2014, issued to U.S. Appl. No. 12/868,099 (66 pages).

* cited by examiner

THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

CLAIM OF PRIORITY

This application makes reference to, incorporates the same herein, and claims priority to and all benefits accruing under 35 U.S.C. §119 from an application earlier filed in the Korean Intellectual Property Office on Jul. 7, 2010 and there duly assigned Serial No. 10-2010-0065465.

BACKGROUND

1. Field

Embodiments of the present invention relate to a thin film deposition apparatus, a method of manufacturing an organic light-emitting display device by using the thin film deposition apparatus, and an organic light-emitting display device manufactured by using the method.

2. Description of the Related Art

Organic light-emitting display devices have a larger viewing angle, better contrast characteristics, and a faster response rate than other display devices, and thus have drawn attention as a next-generation display device.

The above information disclosed in this Related Art section is only for enhancement of understanding of the background of the invention and therefore it may contain information that does not form the prior art that is already known to a person of ordinary skill in the art.

SUMMARY

One or more aspects of embodiments according to the present invention provide a thin film deposition apparatus that is suitable for manufacturing large-sized display devices on a mass scale and that can be used for high-definition patterning, a method of manufacturing an organic light-emitting display device by using the thin film deposition apparatus, and an organic light-emitting display device manufactured by using the method.

According to an aspect of embodiments according to the present invention, there is provided a thin film deposition apparatus for forming a thin film on a substrate, the apparatus includes a deposition source for discharging a deposition material; a deposition source nozzle unit disposed at a side of the deposition source and including a plurality of deposition source nozzles arranged in a first direction; a patterning slit sheet disposed opposite to the deposition source nozzle unit and having a plurality of patterning slits arranged in the first direction; a barrier plate assembly including a plurality of barrier plates that are disposed between the deposition source nozzle unit and the patterning slit sheet in the first direction, the plurality of barrier plates partitioning a deposition space between the deposition source nozzle unit and the patterning slit sheet into a plurality of sub-deposition spaces; and a capacitive vacuum gauge disposed at a side of the deposition source and being configured to measure pressure inside the deposition source.

The capacitive vacuum gauge may include a capacitive manometer, and may be a Baratron® gauge.

The thin film deposition apparatus may be separated from the substrate by a distance. The thin film deposition apparatus or the substrate may be movable relative to the other.

The capacitive vacuum gauge may include a housing; a first vacuum tube for connecting the housing to the deposition source; a diaphragm disposed in the housing, and dividing the inside of the housing into two parts; and an electrode assembly for inducing a capacitance according to a distance between the electrode assembly and the diaphragm.

The diaphragm may be moved toward or to be away from the deposition source, according to pressure of air exhausted or supplied via the first vacuum tube.

The capacitive vacuum gauge may measure absolute pressure inside the deposition source.

The capacitive vacuum gauge may further include a second vacuum tube disposed at a side of one part of the housing that is not connected to the first vacuum tube, wherein the housing is divided into two parts by the diaphragm.

The capacitive vacuum gauge may measure a difference between pressure inside the deposition source, and pressure inside a chamber in which the thin film deposition apparatus is disposed.

An evaporation rate of the deposition material discharged from the deposition source, may be maintained at a substantially constant level by controlling pressure inside the deposition source, which is measured by the capacitive vacuum gauge.

Each of the plurality of barrier plates may extend in a second direction that is substantially perpendicular to the first direction, in order to partition the deposition space between the deposition source nozzle unit and the patterning slit sheet into the plurality of sub-deposition spaces.

The barrier plate assembly may include a first barrier plate assembly including a plurality of first barrier plates, and a second barrier plate assembly including a plurality of second barrier plates.

The plurality of first barrier plates and the plurality of second barrier plates may extend in a second direction that is substantially perpendicular to the first direction, in order to partition the deposition space between the deposition source nozzle unit and the patterning slit sheet into the plurality of sub-deposition spaces.

The deposition material discharged from the thin film deposition apparatus may be continuously deposited on the substrate while the substrate is moved relative to the thin film deposition apparatus.

The thin film deposition apparatus or the substrate may be movable relative to the other along a plane parallel to a surface of the substrate on which the deposition material is deposited.

The patterning slit sheet of the thin film deposition assembly may be smaller than the substrate.

According to another aspect of embodiments according to the present invention, there is provided a thin film deposition apparatus for forming a thin film on a substrate, the apparatus may include a deposition source for discharging a deposition material; a deposition source nozzle unit disposed at a side of the deposition source and including a plurality of deposition source nozzles arranged in a first direction; a patterning slit sheet disposed opposite to the deposition source nozzle unit and having a plurality of patterning slits arranged in a second direction perpendicular to the first direction; and a capacitive vacuum gauge disposed at a side of the deposition source and measuring pressure inside the deposition source, wherein the thin film deposition apparatus is configured to perform deposition while the substrate is moved relative to the thin film deposition apparatus in the first direction.

The capacitive vacuum gauge may include a housing; a first vacuum tube for connecting the housing to the deposition source; a diaphragm disposed in the housing, and dividing the inside of the housing into two parts; and an electrode assembly for inducing a capacitance according to a distance between the electrode assembly and the diaphragm.

The diaphragm may be moved toward or to be away from the deposition source, according to pressure of air exhausted or supplied via the first vacuum tube.

The capacitive vacuum gauge may measure absolute pressure inside the deposition source.

The capacitive vacuum gauge may further include a second vacuum tube disposed at a side of one part of the housing that is not connected to the first vacuum tube, wherein the housing is divided into two parts by the diaphragm.

The capacitive vacuum gauge may measure a difference between pressure inside the deposition source, and pressure inside a chamber in which the thin film deposition apparatus is disposed.

An evaporation rate of the deposition material discharged from the deposition source, may be maintained at a substantially constant level by controlling pressure inside the deposition source, which is measured by the capacitive vacuum gauge.

The deposition source, the deposition source nozzle unit, and the patterning slit sheet may be integrally formed as one body.

The thin film deposition apparatus may be separated from the substrate by a distance.

The deposition material discharged from the thin film deposition apparatus may be continuously deposited on the substrate while the substrate is moved relative to the thin film deposition apparatus in the first direction.

The patterning slit sheet of the thin film deposition assembly may be smaller than the substrate.

According to another aspect of embodiments according to the present invention, there is provided a method of manufacturing an organic light-emitting display device, the method may include disposing a thin film deposition apparatus apart from a substrate, which is a deposition target substrate and is fixedly supported by a chuck, so as to perform deposition on the substrate while the thin film deposition apparatus or the substrate is moved relative to the other.

The thin film deposition apparatus may include a deposition source for discharging a deposition material; a deposition source nozzle unit disposed at a side of the deposition source and including a plurality of deposition source nozzles arranged in a first direction; a patterning slit sheet disposed opposite to the deposition source nozzle unit and having a plurality of patterning slits arranged in the first direction; a barrier plate assembly including a plurality of barrier plates that are disposed between the deposition source nozzle unit and the patterning slit sheet in the first direction, the plurality of barrier plates partitioning a deposition space between the deposition source nozzle unit and the patterning slit sheet into a plurality of sub-deposition spaces; and a capacitive vacuum gauge disposed at a side of the deposition source and measuring pressure inside the deposition source.

According to another aspect of embodiments according to the present invention, there is provided a method of manufacturing an organic light-emitting display device, the method may include disposing a thin film deposition apparatus apart from a substrate, which is a deposition target substrate and is fixedly supported by a chuck, so as to perform deposition on the substrate while the thin film deposition apparatus or the substrate is moved relative to the other.

The thin film deposition apparatus may include a deposition source for discharging a deposition material; a deposition source nozzle unit disposed at a side of the deposition source and including a plurality of deposition source nozzles arranged in a first direction; a patterning slit sheet disposed opposite to the deposition source nozzle unit and having a plurality of patterning slits arranged in a second direction perpendicular to the first direction; and a capacitive vacuum gauge disposed at a side of the deposition source and measuring pressure inside the deposition source, wherein deposition is performed while the substrate is moved relative to the thin film deposition apparatus in the first direction.

According to another aspect of embodiments according to the present invention, there is provided an organic light-emitting display device manufactured using one of the above methods.

BRIEF DESCRIPTION OF THE DRAWINGS

A more complete appreciation of the invention, and aspects thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
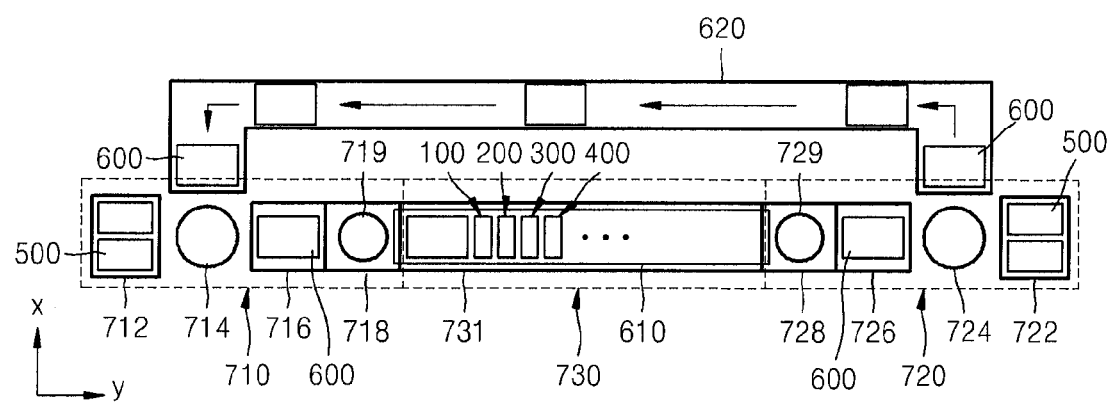
FIG. 1 is a schematic view of a thin film deposition apparatus according to an embodiment of the present invention.

The present invention will now be described more fully with reference to the accompanying drawings in which exemplary embodiments of the invention are shown. In the drawings, the thicknesses of layers and regions are exaggerated for clarity. Like reference numerals in the drawings denote like elements, and thus their description will be omitted.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

In order to clarify the present invention, some of the elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

An organic light-emitting display device may include intermediate layers, including an emission layer disposed between a first electrode and a second electrode that are arranged opposite to each other. The electrodes and the intermediate layers may be formed via various methods, one of which is a separate deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

However, the deposition method using such an FMM is not suitable for manufacturing larger devices using a mother glass having a size of 5G or greater. In other words, when such a large mask is used, the mask may bend due to self-gravity, thereby distorting a pattern. This is not conducive for the recent trend towards high-definition patterns.

Figure 2:
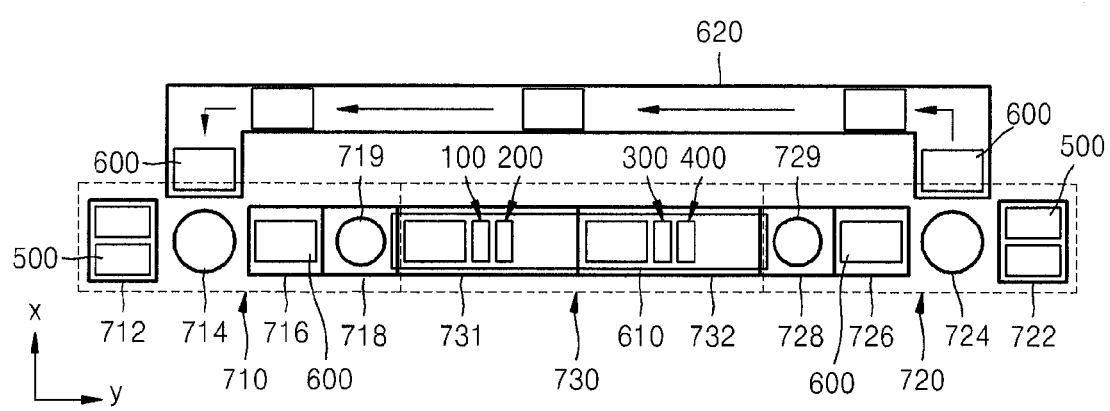
FIG. 2 illustrates a modified example of the thin film deposition apparatus of FIG. 1.
Figure 3:
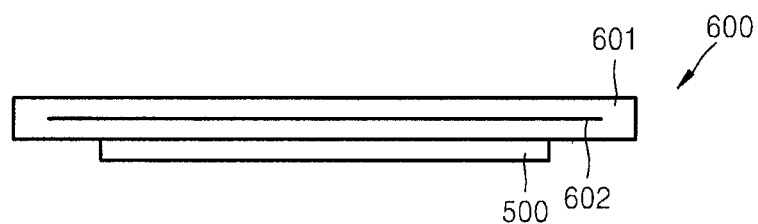
FIG. 3 is a cross-sectional view of an example of an electrostatic chuck of FIG. 1.

FIG. 1 is a schematic perspective view of a thin film deposition apparatus according to an embodiment of the present invention. FIG. 2 illustrates a modified example of the thin film deposition apparatus of FIG. 1. FIG. 3 is a view of an example of an electrostatic chuck 600 included in the thin film deposition apparatus of FIG. 1.

Referring to FIG. 1, the thin film deposition apparatus includes a loading unit 710, a deposition unit 730, an unloading unit 720, a first conveyer unit 610, and a second conveyer unit 620.

The loading unit 710 includes a first rack 712, a transport robot 714, a transport chamber 716, and a first inversion chamber 718.

A plurality of substrates 500 onto which a deposition material is not applied are stacked on the first rack 712. The transport robot 714 picks up one of the substrates 500 from the first rack 712, disposes it on the electrostatic chuck 716 transferred by the second conveyor unit 620, and moves the electrostatic chuck 600 on which the substrate 500 is disposed into the transport chamber 716.

The first inversion chamber 718 is disposed adjacent to the transport chamber 716. The first inversion chamber 718 includes a first inversion robot 719 that inverts the electrostatic chuck 600 and then loads it into the first conveyer unit 610 of the deposition unit 730.

Referring to FIG. 3, the electrostatic chuck 600 may include an electrode 602 embedded in a main body 601 formed of ceramic, wherein the electrode 602 is supplied with power. The substrate 500 may be attached to a surface of the main body 601 when a high voltage is applied to the electrode 602.

Referring to FIG. 1, the transport robot 714 places one of the substrates 500 on the electrostatic chuck 600, and the electrostatic chuck 600 on which the substrate 500 is disposed may be loaded into the transport chamber 716. The first inversion robot 716 inverts the electrostatic chuck 600 in such a manner that the substrate 500 may be turned upside down in the deposition unit 730.

The unloading unit 720 may be constituted to operate in an opposite manner to the loading unit 710 described above. Specifically, a second inversion robot 729 in a second inversion chamber 728 inverts the electrostatic chuck 600 having the substrate 500 thereon, which has passed through the deposition unit 728, and then moves the electrostatic chuck 600 having the substrate 500 thereon into an ejection chamber 726. Then, an ejection robot 729 removes the electrostatic chuck 600 having the substrate 500 thereon from the ejection chamber 726, separates the substrate 500 from the electrostatic chuck 600, and then loads the substrate 500 onto the second rack 724. The electrostatic chuck 600 separated from the substrate 500 may be returned back into the loading unit 710 via the second conveyer unit 620.

However, the present invention is not limited to the above description. For example, when disposing the substrate 500 on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729 are not required.

The deposition unit 730 may include at least one deposition chamber. Referring to FIG. 1, the deposition unit 730 may include a first chamber 731, in which first to fourth thin film deposition assemblies 100, 200, 300, and 400 are disposed. Although FIG. 1 illustrates that a total of four thin film deposition assemblies, i.e., the first to fourth thin film deposition assemblies 100 to 400, are installed in the first chamber 731, the total number of thin film deposition assemblies that may be installed in the first chamber 731 may vary according to a deposition material and deposition conditions. The first chamber 731 is maintained in a vacuum state during a deposition process.

Referring to FIG. 2, according to another embodiment of the present invention, a deposition unit 730 includes a first chamber 731 and a second chamber 732 that are connected to each other, first and second thin film deposition assemblies 100 and 200 are disposed in the first chamber 731, and third and fourth thin film deposition assemblies 300 and 400 are disposed in the second chamber 732. In other embodiments, more than two thin film deposition assemblies may be disposed in each of the first and second chambers 731 and 732.

In the current embodiment of FIG. 1, the electrostatic chuck 600 having the substrate 500 disposed thereon may be moved at least to the deposition unit 730 or may be moved sequentially to the loading unit 710, the deposition unit 730, and the unloading unit 720, by the first conveyor unit 610. If the substrate is separated from the electrostatic chuck 600 in the unloading unit 720, then the electrostatic chuck 600 may be moved back to the loading unit 710 by the second conveyor unit 620.

Figure 4:
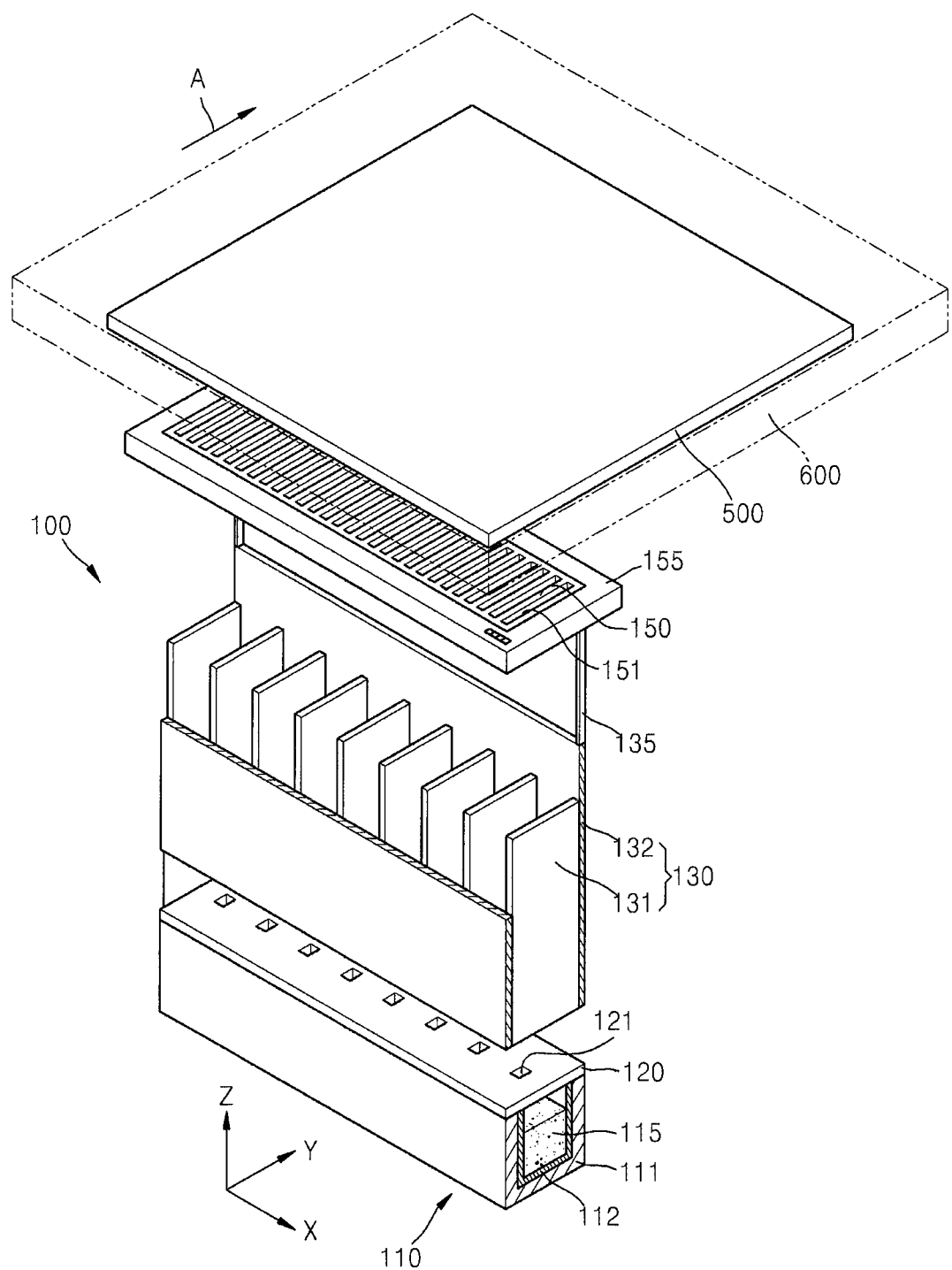
FIG. 4 is a schematic perspective view of a thin film deposition assembly of the thin film deposition apparatus of FIG. 1, according to an embodiment of the present invention.
Figure 5:
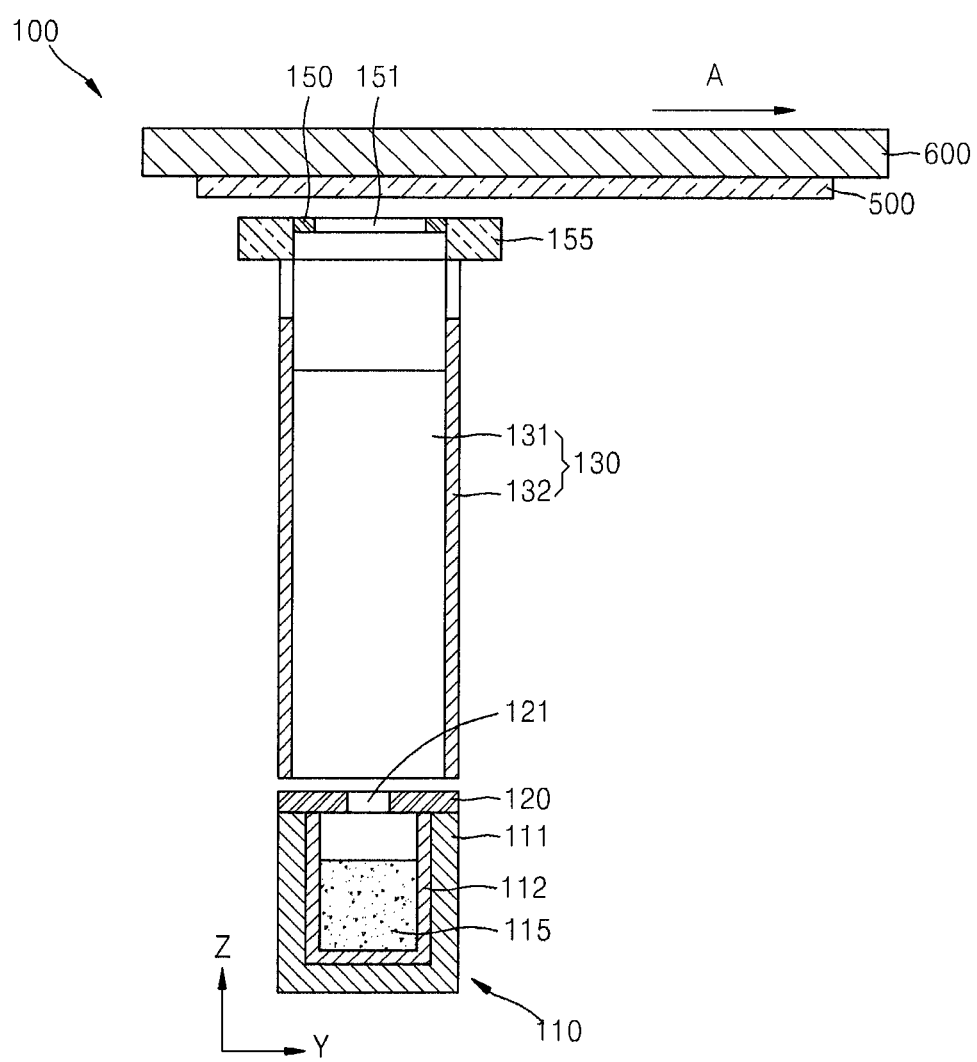
FIG. 5 is a schematic sectional side view of the thin film deposition assembly of FIG. 4.
Figure 6:
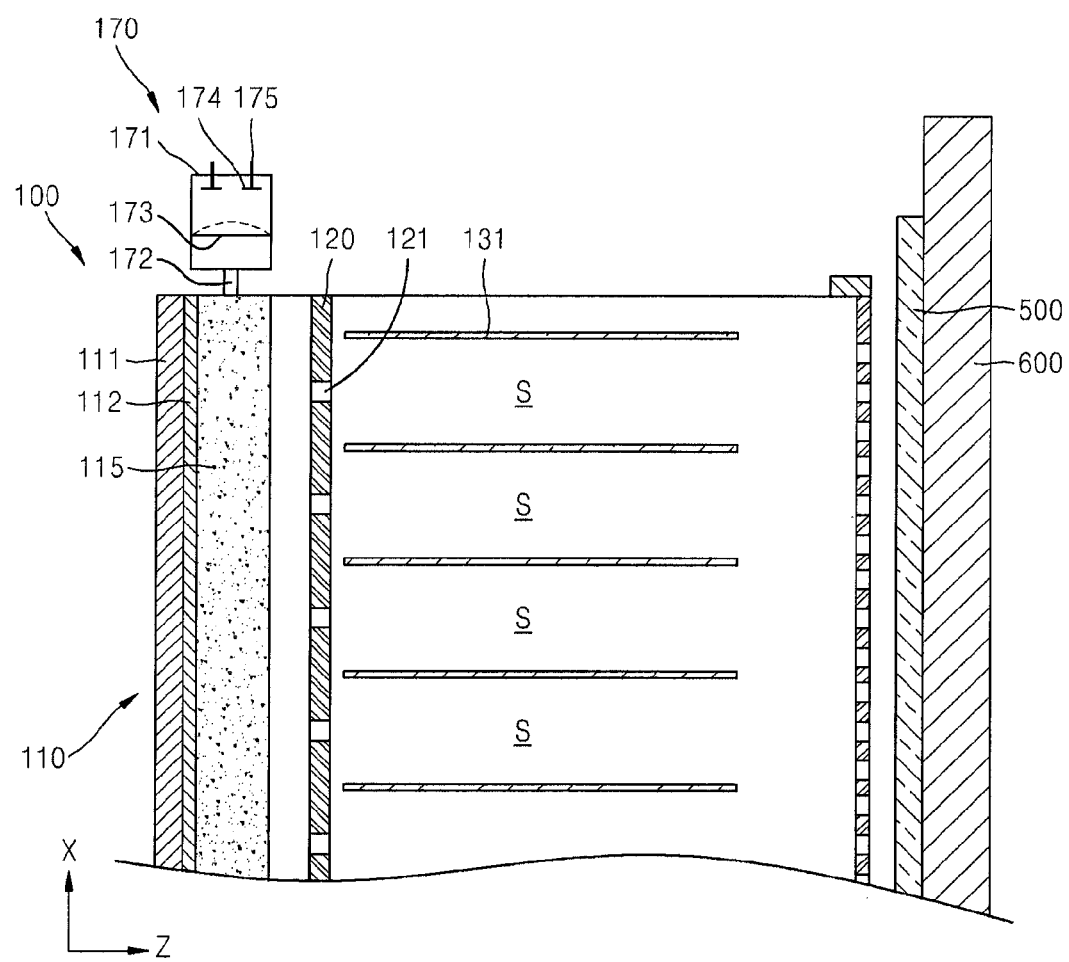
FIG. 6 is a schematic plan view of the thin film deposition assembly of FIG. 4.

An embodiment of the thin film deposition assembly 100 of the thin film deposition apparatus described above will now be described. FIG. 4 is a schematic perspective view of the thin film deposition assembly 100 of the thin film deposition apparatus of FIG. 1, according to an embodiment of the present invention. FIG. 5 is a cross-sectional side view of the thin film deposition assembly 100 illustrated in FIG. 4. FIG. 6 is a cross-sectional plan view of the thin film deposition assembly 100 illustrated in FIG. 4.

Referring to FIGS. 4 to 6, the thin film deposition assembly 100 includes a deposition source 110, a deposition source nozzle unit 120, a barrier plate assembly 130, a patterning slit sheet 150, and a capacitive vacuum gauge (e.g., Baratron® gauge) 170. BARATRON® is a registered trademark of MKS Instruments, Inc., Andover, Mass. A Baratron gauge, which may also be referred to as a Baratron gage, is a capacitive manometer for vacuum measurement that is known to those skilled in the art. While embodiments of the present invention are described primarily in reference to a Baratron gauge, those skilled in the art would appreciate that any other suitable capacitive manometer or capacitive vacuum gauge (or a capacitive vacuum measuring device) may be used.

Although a chamber is not illustrated in FIGS. 4 through 6 for the convenience of explanation, all the components of the thin film deposition assembly 100 may be disposed within a chamber that may be maintained at an appropriate degree of vacuum. Further, although the capacitive vacuum gauge 170 is not specifically shown in FIGS. 4 and 5 for the convenience of illustration, as shown in FIG. 6, the embodiment illustrated in FIGS. 4-6 includes the capacitive vacuum gauge 170. The chamber may be maintained at an appropriate vacuum in order to allow a deposition material 115 to move in a substantially straight line through the thin film deposition assembly 100.

In particular, the chamber should be maintained in a high-vacuum state so that the deposition material 115 discharged from the deposition source 110 may pass through the deposition source nozzle unit 120 and the patterning slits 150 and then be deposited onto the substrate 500 in a desired pattern. In addition, the temperatures of the barrier wall assembly 130 and a patterning slit sheet 150 should be sufficiently lower than the temperature of the deposition source 110 so as to maintain a space between the deposition source nozzle unit 120 and the patterning slit sheet 150 in a high-vacuum state. In this regard, the temperatures of the barrier wall assembly 130 and the patterning slit sheet 150 may be about 100° C. or less. This is because the deposition material 115 that has collided with the barrier plate assembly 130 may not be vaporized again when the temperatures of the barrier plate assembly 130 and the patterning slit sheet 150 are sufficiently low. In addition, thermal expansion of the patterning slit sheet 150 may be reduced or minimized when the temperature of the patterning slit sheet 150 is sufficiently low. The barrier plate assembly 130 faces the deposition source 110 which may be at a high temperature. Since the temperature of a portion of the barrier plate assembly 130 close to the deposition source 110 may rise by a maximum of about 167° C., a partial-cooling apparatus (not shown) may be further included if needed.

In the chamber, the substrate 500 that is a deposition target substrate, may be transferred by the electrostatic chuck 600. The substrate 500 may be a substrate for flat panel displays. A large substrate, such as a mother glass, for manufacturing a plurality of flat panel displays, may be used as the substrate 500. Other substrates may also be employed.

In the current embodiment, the substrate 500 may be moved relative to the thin film deposition assembly 100. For example, as illustrated in FIG. 4, the substrate 500 may be moved in a direction of an arrow A, relative to the thin film deposition assembly 100.

In a conventional deposition method using a fine metal mask (FMM), the size of the FMM has to be greater than or equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the thin film deposition assembly 100 according to the current embodiment, deposition may be performed while the thin film deposition assembly 100 or the substrate 500 may be moved relative to the other. In other words, deposition may be continuously performed while the substrate 500, which may be disposed so as to face the thin film deposition assembly 100, may be moved in a Y-axis direction. In other words, deposition may be performed in a scanning manner while the substrate 500 may be moved in the direction of arrow A. Although the substrate 500 is illustrated as being moved in the chamber in the Y-axis direction in FIG. 3 when deposition is performed, aspects of the present invention are not limited thereto. For example, deposition may be performed while the thin film deposition assembly 100 is moved in the Y-axis direction, whereas the substrate 500 is fixed. In other embodiments, both the thin film deposition assembly 100 and the substrate 500 may be moved with respect to each other.

Thus, in the thin film deposition assembly 100 according to the current embodiment, the patterning slit sheet 150 may be significantly smaller than the FMM used in the conventional deposition method. That is, in the thin film deposition assembly 100, deposition is continuously performed, i.e., in a scanning manner while the substrate 500 is moved in the Y-axis direction. Thus, a length of the patterning slit sheet 150 in the Y-axis direction may be significantly less than a length of the substrate 500 provided that a width of the patterning slit sheet 150 in the X-axis direction and a width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in the scanning manner while the substrate 500 or the thin film deposition assembly 100 is moved relative to the other.

As described above, since the patterning slit sheet 150 may be formed to be significantly smaller than the FMM used in the conventional deposition method, the patterning slit sheet 150 is easy to manufacture. In other words, using the patterning slit sheet 150, which is smaller than the FMM used in the conventional deposition method, is more convenient in all processes, including etching and other subsequent processes, such as precise extension, welding, moving, and cleaning processes, compared to the conventional deposition method using the larger FMM. This is more advantageous for a relatively large display device.

The thin film deposition assembly 100 and the substrate 500 may be separated from each other (e.g., separated by a predetermined distance) so that deposition may be performed while the thin film deposition assembly 100 or the substrate 500 may be moved relative to the other as described above. This will be described later in detail.

The deposition source 110 that contains and heats the deposition material 115 may be disposed at an opposite side of the chamber to a side at which the substrate 500 is disposed.

The deposition source 110 includes a crucible 112 that may be filled with the deposition material 115, and a cooling block 111 surrounding the crucible 112. The cooling block 111 prevents radiation of heat from the crucible 112 outside, i.e., into the chamber. The cooling block 111 may include a heater (not shown) that heats the crucible 112.

The capacitive vacuum gauge 170 may further be disposed at a side of the deposition source 110. As will be described in detail later, the capacitive vacuum gauge 170 may measure pressure inside the deposition source 110 so as to control an evaporation rate of the deposition material 115.

The deposition source nozzle unit 120 may be disposed at a side of the deposition source 110, and in particular, at the side of the deposition source 110 facing the substrate 500. The deposition source nozzle unit 120 includes a plurality of deposition source nozzles 121 that may be arranged at equal intervals in the X-axis direction. The deposition material 115 that is vaporized in the deposition source 110 passes through the plurality of deposition source nozzles 121 of the deposition source nozzle unit 120 towards the substrate 500 that is a deposition target substrate.

The barrier plate assembly 130 is disposed at a side of the deposition source nozzle unit 120. The barrier plate assembly 130 includes a plurality of barrier plates 131, and a barrier plate frame 131 that covers sides of the barrier plates 132. The plurality of barrier plates 131 may be arranged parallel to each other at equal intervals in the X-axis direction. Each of the barrier plates 131 may be arranged parallel to an YZ plane in FIG. 4, and may have a rectangular shape. The plurality of barrier plates 131 arranged as described above partition a deposition space between the deposition source nozzle unit 120 and the patterning slit sheet 150 into a plurality of sub-deposition spaces S. In the thin film deposition assembly 100, as illustrated in FIG. 6, the deposition space may be divided by the barrier plates 131 into the sub-deposition spaces S that respectively correspond to the deposition source nozzles 121 through which the deposition material 115 may be discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. However, the present invention is not limited to this structure. For example, a plurality of deposition source nozzles 121 may be disposed between two adjacent barrier plates 131. In this case, the deposition source nozzles 121 may be also respectively located at the midpoint between two adjacent barrier plates 131.

Since the barrier plates 131 partition the space between the deposition source nozzle unit 120 and the patterning slit sheet 150 into the plurality of sub-deposition spaces S as described above, the deposition material 115 discharged through each of the deposition source nozzles 121 is not mixed with the deposition material 115 discharged through the other deposition source nozzles slits 121, and passes through a plurality of patterning slits 151 so as to be deposited on the substrate 500. In other words, the barrier plates 131 guide the deposition material 115, which may be discharged through the deposition source nozzles slits 121, to move straight and not to flow in the X-axis direction.

As described above, the deposition material 115 is forced to move straight by installing the barrier plates 131, so that a smaller shadow zone may be formed on the substrate 500 compared to a case where no barrier plates are installed. Thus, the thin film deposition assembly 100 and the substrate 400 can be separated from each other by a distance (e.g., a predetermined distance). This will be described later in detail.

The barrier plate frame 132, which covers the sides of the barrier plates 131, maintains the positions of the barrier plates 131, and guides the deposition material 115, which may be discharged through the deposition source nozzles 121, not to flow in the Y-axis direction. In other words, the barrier plate frame 132 in the embodiment of FIGS. 4-6 includes two opposing barrier frame plates that are spaced from each other along the Y-axis direction with the barrier plates 131 located therebetween. While the barrier frame plate on the left side in FIG. 4 appears as being less in height than the one on the right side, they may have the same height as illustrated in FIG. 5.

The deposition source nozzle unit 120 and the barrier plate assembly 130 may be separated from each other by a distance (e.g., a predetermined distance). This may prevent the heat radiated from the deposition source unit 110 from being conducted to the barrier plate assembly 130. However, aspects of the present invention are not limited to this. For example, an appropriate heat insulator (not shown) may be further disposed between the deposition source nozzle unit 120 and the barrier plate assembly 130. In this case, the deposition source nozzle unit 120 and the barrier plate assembly 130 may be bound together with the heat insulator therebetween.

In addition, the barrier plate assembly 130 may be constructed to be detachable from the thin film deposition assembly 100. In the thin film deposition assembly 100 of the thin film deposition apparatus according to the current embodiment, the deposition space may be enclosed by using the barrier plate assembly 130, so that the deposition material 115 that remains undeposited may be mostly deposited within the barrier plate assembly 130. Thus, since the barrier plate assembly 130 may be constructed to be detachable from the thin film deposition assembly 100, when a large amount of the deposition material 115 lies in the barrier plate assembly 130 after a long deposition process, the barrier plate assembly 130 may be detached from the thin film deposition assembly 100 and then placed in a separate deposition material recycling apparatus in order to recover the deposition material 115. Due to the structure of the thin film deposition assembly 100, a reuse rate of the deposition material 115 may be increased, so that the deposition efficiency may be improved, and thus the manufacturing costs may be reduced.

The patterning slit sheet 150 and a frame 155 are disposed between the deposition source 110 and the substrate 500. The frame 155 may be formed in a lattice shape, similar to a window frame. The patterning slit sheet 150 may be bound inside the frame 155. The patterning slit sheet 150 has the plurality of patterning slits 151 arranged in the X-axis direction. The patterning slits 151 extend in the Y-axis direction. The deposition material 115 that has been vaporized in the deposition source 110 and passed through the deposition source nozzle 121, passes through the patterning slits 151 towards the substrate 500.

The patterning slit sheet 150 may be formed of a metal thin film. The patterning slit sheet 150 may be fixed to the frame 155 such that a tensile force is exerted thereon. In other words, the frame 155 may apply a stretching (or pulling) force to the patterning slit sheet 150 toward the peripheral edges. The patterning slits 151 may be formed by etching the patterning slit sheet 150 to a stripe pattern.

In the thin film deposition assembly 100 according to the current embodiment, the total number of the patterning slits 151 may be greater than the total number of the deposition source nozzles 121. In addition, the total number of the patterning slits 151 may be greater than the total number of deposition source nozzles 121 disposed between two adjacent barrier plates 131. The number of patterning slits 151 may be equal to the number of deposition patterns to be formed on the substrate 500.

The barrier plate assembly 130 and the patterning slit sheet 150 may be disposed to be separated from each other by a distance (e.g., a predetermined distance). Alternatively, the barrier plate assembly 130 and the patterning slit sheet 150 may be connected by connection units 135. The temperature of the barrier plate assembly 130 may increase to 100° or higher due to the deposition source 110 whose temperature is high. Thus, the barrier plate assembly 130 and the patterning slit sheet 150 are separated from each other by the distance (e.g., the predetermined distance) in order to prevent the heat of the barrier plate assembly 130 from being conducted to the patterning slit sheet 150.

As described above, the thin film deposition assembly 100 according to the current embodiment performs deposition while being moved relative to the substrate 500. In order to move the thin film deposition assembly 100 relative to the substrate 500, the patterning slit sheet 150 may be separated from the substrate 500 (e.g., separated by the predetermined distance). In addition, in order to prevent formation of a relatively large shadow zone on the substrate 500 when the patterning slit sheet 150 and the substrate 500 are separated from each other, the barrier plates 131 are arranged between the deposition source nozzle unit 120 and the patterning slit sheet 150 to force the deposition material 115 to move in a straight direction. Thus, the size of the shadow zone that may be formed on the substrate 500 is sharply reduced.

In particular, in a conventional deposition method using an FMM, deposition may be performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition assembly 100 according to the current embodiment, the patterning slit sheet 150 may be disposed to be separated from the substrate 500 (e.g., separated by a predetermined distance). This may be facilitated by installing the barrier plates 131 to reduce the size of the shadow zone formed on the substrate 500.

As described above, when the patterning slit sheet 150 is manufactured to be smaller than the substrate 500, the patterning slit sheet 150 may be moved relative to the substrate 500 during deposition. Thus, it is no longer necessary to manufacture a large FMM as used in the conventional deposition method. Since the substrate 500 and the patterning slit sheet 150 are separated from each other, defects caused due to contact therebetween may be prevented. In addition, since it is unnecessary to contact the substrate 500 with the patterning slit sheet 150 during a deposition process, the manufacturing speed may be improved.

In the current embodiment, the thin film deposition assembly 100 further includes the capacitive vacuum gauge 170 at a side of the deposition source 110.

In general, a conventional thin film deposition apparatus employs a crystal sensor so as to measure an evaporation rate of a deposition material. The thickness of a thin film formed on a substrate may be controlled by controlling the measured evaporation rate. However, when the evaporation rate of the deposition material is measured using the crystal sensor, the sensitivity of the crystal sensor may vary as the deposition material is accumulatively applied onto the crystal sensor. Thus, an actual evaporation rate may be different from the evaporation rate measured by the crystal sensor.

To solve this problem, a method of measuring an evaporation rate of a deposition material by measuring pressure inside a deposition source, has been introduced. In this method, a Pirani gauge may be employed so as to measure heat conductivity according to pressure applied between a heated filament and a body of a pressure meter. However, when the Pirani gauge is used, the temperature of the inside of a deposition source should be maintained to be higher than a temperature when a vapor of a deposition material is condensed so as to prevent an organic material vapor from being condensed on the filament and the pressure meter. However, the properties of an organic material that constitutes the deposition material are weak, and are thus likely to be degraded when the filament is heated. If the temperature of the filament is lowered to prevent the degradation in the properties of the organic material, the difference between the temperatures of the body of the pressure meter and the filament may be reduced, thus lowering the heat conductivity. In this case, the sensitivity of the crystal sensor may be degraded.

To solve this problem, the thin film deposition assembly 100 includes the capacitive vacuum gauge 170 as a pressure measuring unit, so that pressure inside the deposition source 110 may be measured without degrading the properties of the deposition material 115 which may be an organic material. Here, the term "capacitive vacuum gauge" refers to a pressure measuring unit for measuring pressure (e.g., degree of vacuum) by measuring a capacitance change between two fixed electrodes adjacent to a metal diaphragm. The capacitive vacuum gauge may be a capacitive manometer, one example of which is a Baratron gauge. A backside of the diaphragm may be set to be in a vacuum state that is far higher than a lowest limit that can be measured. Also, the diaphragm has better repeatability, a quick response time, and a very high resolution of $1\times10-5$ (full scale), and is therefore capable of measuring a very low pressure.

Referring to FIG. 6, the capacitive vacuum gauge 170 includes a housing 171, a first vacuum tube 172, a diaphragm 173, an electrode assembly 174, and a voltage application line 175.

In detail, the first vacuum tube 172 branches off from the deposition source 110, and one end of the first vacuum tube 172 may be connected to the housing 171 that covers sides of the capacitive vacuum gauge 170.

In the housing 171, the diaphragm 173, the electrode assembly 174, and the voltage application line 175 are installed. The state of the diaphragm 173 changes according to the pressure inside the deposition source 110. The electrode assembly 174 induces an electrical capacitance according to a distance between the electrode assembly 174 and the diaphragm 173. Power may be supplied to the electrode assembly 174 via the voltage application line 175. The diaphragm 173 may expand from side to side in a horizontal direction according to the pressure of air exhausted or supplied via the first vacuum tube 172 connected to the deposition source 110.

Although not shown, a reference pressure vacuum tube (not shown) may further be installed at a side of the housing 171 so as to allow the diaphragm 173 to be in a reference vacuum state. The reference pressure vacuum tube may be sealed by the diaphragm 173 and the housing 171 to be in a predetermined pressure state.

Thus, the capacitive vacuum gauge 170 measures the electrical capacitance induced between the diaphragm 173 and the electrode assembly 174 and transmits a pressure sensing signal to a controller (not shown).

As described above, an absolute pressure inside the deposition source 110 may be measured by integrally installing the capacitive vacuum gauge 170 and the deposition source 110 in a body and maintaining the temperatures in the capacitive vacuum gauge 170 and the deposition source 110 to be equal to each other. The deposition material 115 may be vaporized, which is caused by the difference between the pressures in the deposition source 110 and the chamber. In a typical thin film deposition process, a chamber may be in a high vacuum state that is approximately $10^{-6}$ Torr, and the pressure inside the deposition source 110 is about $10^{-2}$ Torr. Even if it is assumed that the amount of the vaporized deposition material 115 is proportional to only the pressure inside the deposition source 110, an error in the amount of the deposition material 115 that is actually vaporized is not large. Thus, the amount of the deposition material 115 to be vaporized may be measured by measuring the pressure inside the deposition source 110.

According to embodiments of the present invention, an absolute pressure inside a deposition source may be measured without damaging a deposition material. Accordingly, it is possible to precisely monitor and control a deposition rate while reducing an error in measurement, caused by pollution of a sensor. Also, it is possible to reduce a production loss, caused when a sensing error is compensated for by periodically forming a thin film on a dummy substrate during use of a conventional crystal sensor.

Figure 7:
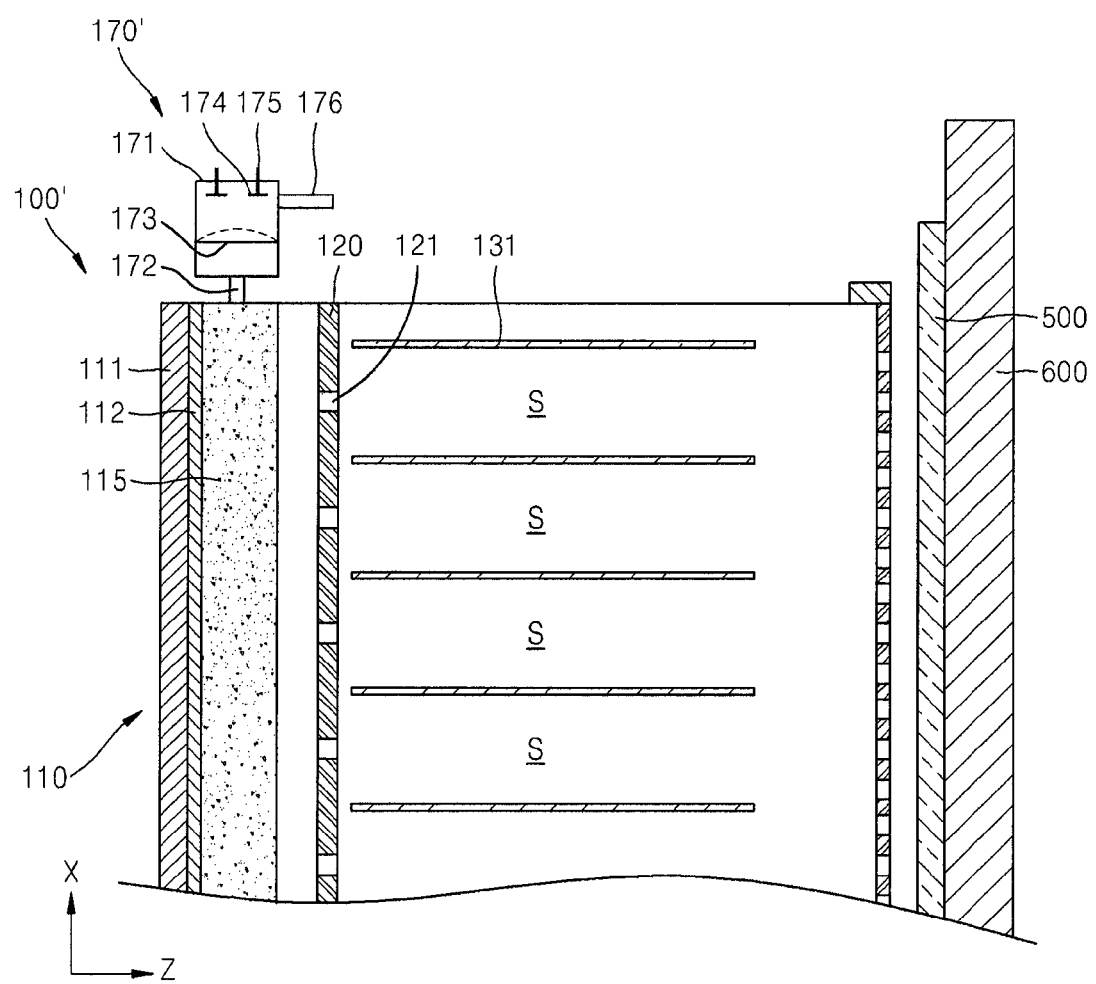
FIG. 7 is a schematic perspective view of a thin film deposition assembly according to another embodiment of the present invention.

FIG. 7 is a schematic perspective view of a thin film deposition assembly 100' according to another embodiment of the present invention. The structure of a capacitive vacuum gauge 170' included in the thin film deposition assembly 100' is different from that of the capacitive vacuum gauge 170 in the thin film deposition assembly 100 of FIG. 6. Thus, the thin film deposition assembly 100' will now be described by focusing on this difference.

Referring to FIG. 7, the capacitive vacuum gauge 170' includes a housing 171, a first vacuum tube 172, a diaphragm 173, an electrode assembly 174, a voltage application line 175, and a second vacuum tube 176.

In detail, the first vacuum tube 172 extends from a deposition source 110, and one end of the first vacuum tube 172 may be connected to the housing 171 that covers sides of the capacitive vacuum gauge 170'.

In the housing 171, the diaphragm 173, the electrode assembly 174, and the voltage application line 175 are installed. The state of the diaphragm 173 changes according to the pressure inside the deposition source 110. The electrode assembly 174 induces an electrical capacitance according to a distance between the electrode assembly 174 and the diaphragm 173. Power may be supplied to the electrode assembly 174 via the voltage application line 175. The diaphragm 173 may expand in a direction perpendicular to the X-axis direction, according to the pressure of air exhausted or supplied via the first vacuum tube 172 connected to the deposition source 110.

Compared to the capacitive vacuum gauge 170 of the thin film deposition assembly 100 of FIG. 6, the capacitive vacuum gauge 170' of the thin film deposition assembly 100' further includes the second vacuum tube 176. In general, a chamber (not shown) should be maintained at a constant vacuum level (or a substantially constant vacuum level), but in some cases, during processes, this may be impossible or very difficult for various reasons. In these cases, the difference between the pressures in the deposition source 110 and the chamber may be measured and controlled so as to maintain an evaporation rate at a constant level (or a substantially constant level). The difference between the pressures in the deposition source 110 and the chamber may be measured by installing the second vacuum tube 176 at a side of the housing 171, and particularly, at a side of one part of the housing 171 that is not connected to the first vacuum tube 172, where the housing 171 may be divided into two parts by the diaphragm 173.

The amount of the deposition material 115 that is vaporized may be measured by measuring the difference between the pressures in the deposition source 110 and the chamber.

As described above, according to embodiments of the present invention, an absolute pressure inside a deposition source may be measured without damaging a deposition material. Accordingly, it is possible to precisely monitor and control a deposition rate while reducing an error in measurement, caused by pollution of a sensor.

Figure 8:
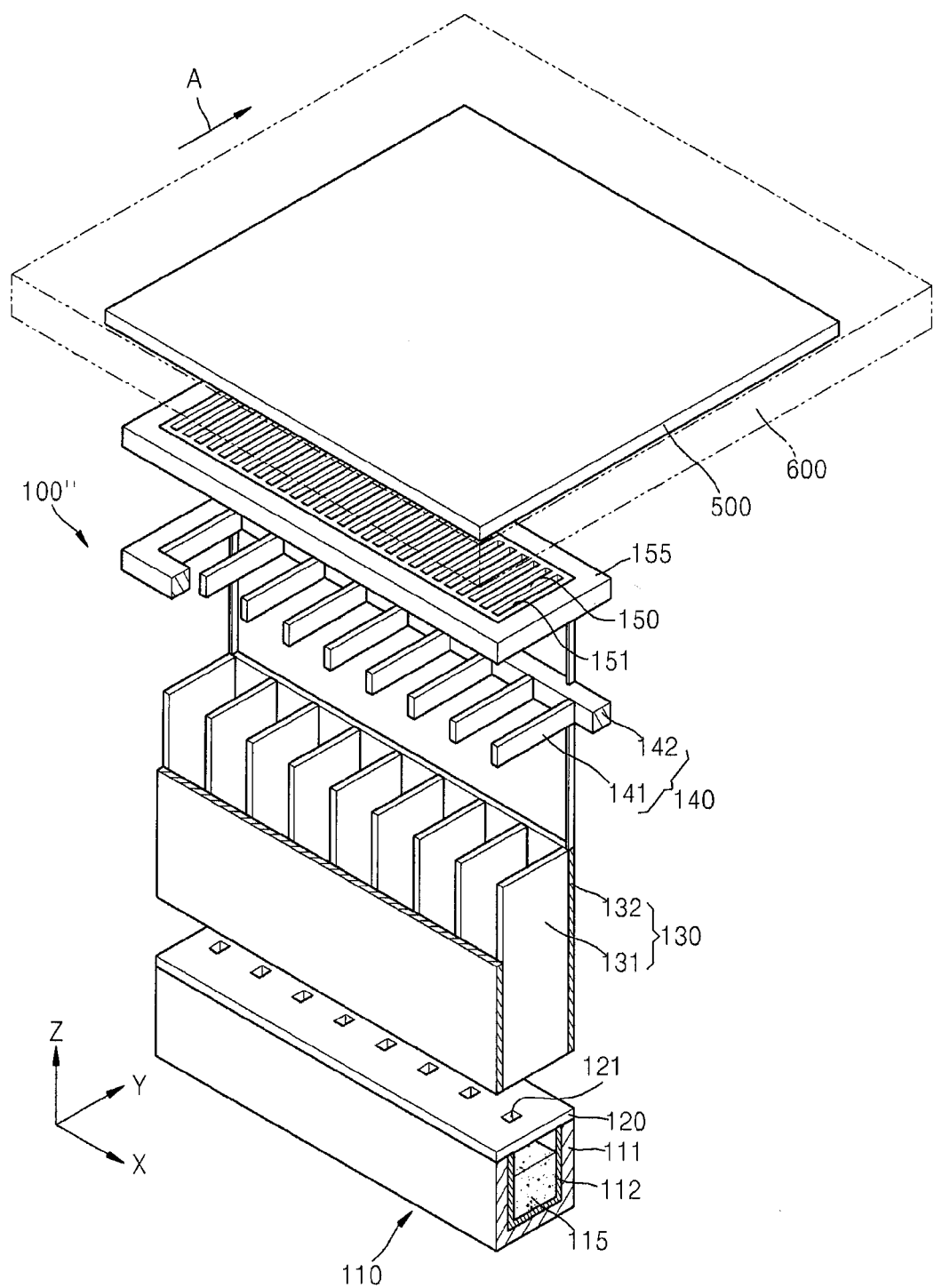
FIG. 8 is a schematic perspective view of a thin film deposition assembly according to another embodiment of the present invention.

FIG. 8 is a schematic perspective view of a thin film deposition assembly 100'' according to another embodiment of the present invention. Referring to FIG. 8, the thin film deposition assembly 100'' includes a deposition source 110, a deposition source nozzle unit 120, a first barrier plate assembly 130, a second barrier plate assembly 140, and a patterning slit sheet 150.

Although a chamber is not illustrated in FIG. 8 for the convenience of explanation, all the components of the thin film deposition assembly 100'' may be disposed within a chamber that is maintained at an appropriate degree of vacuum. The chamber may be maintained at an appropriate degree of vacuum in order to allow a deposition material 115 to move in a substantially straight line through the thin film deposition assembly 100''.

The substrate 500, which may be a deposition target substrate, may be disposed in the chamber. The deposition source 110 that contains and heats the deposition material 115 may be disposed in an opposite side of the chamber to a side in which the substrate 500 may be disposed.

The structures of the deposition source 110 and the patterning slit sheet 150 are the same as those in the embodiment described with reference to FIG. 4, and thus a detailed description thereof will not be provided here. The first barrier plate assembly 130 may be also the same as the barrier plate assembly 130 of the embodiment described with reference to FIG. 4, and thus a detailed description thereof will not be provided here.

In the current embodiment, the second barrier plate assembly 140 may be disposed at a side of the first barrier plate assembly 130. The second barrier plate assembly 140 includes a plurality of second barrier plates 141, and a second barrier plate frame 142 that covers sides of the plurality of second barrier plates 141.

The plurality of second barrier plates 141 may be arranged parallel to each other at equal intervals in the X-axis direction. In addition, each of the plurality of second barrier plates 141 may be formed to extend in the YZ plane in FIG. 8, i.e., perpendicular to the X-axis direction.

The plurality of first barrier plates 131 and the plurality of second barrier plates 141 arranged as described above partition a deposition space between the deposition source nozzle unit 120 and the patterning slit sheet 150. The deposition space may be divided by the plurality of first barrier plates 131 and the plurality of second barrier plates 141 into sub-deposition spaces that respectively correspond to the deposition source nozzles 121 through which the deposition material 115 may be discharged.

The plurality of second barrier plates 141 may be disposed to correspond respectively to the first barrier plates 131. In other words, the plurality of second barrier plates 141 may be aligned with respect to the plurality of first barrier plates 131, respectively. That is, each pair of the corresponding first and second barrier plates 131 and 141 may be located on the same plane. The plurality of first barrier plates 131 and the plurality of second barrier plates 141 are respectively illustrated as having the same thickness in the X-axis direction, but aspects of the present invention are not limited thereto. In other words, the second barrier plates 141, which need to be accurately aligned with the patterning slits 151, may be formed to be relatively thin, whereas the first barrier plates 131, which do not need to be precisely aligned with the patterning slits 151, may be formed to be relatively thick. This makes it easier to manufacture the thin film deposition assembly 100".

A plurality of thin film deposition assemblies 100" of FIG. 8 may be successively disposed in the first chamber 731 of FIG. 1. In this case, the plurality of thin film deposition assemblies 100" may be used to deposit different deposition materials, respectively. For example, the plurality of thin film deposition assemblies 100" may have different patterning slit patterns, so that pixels of different colors, for example, red, green and blue, may be simultaneously defined through a film deposition process.

Figure 9:
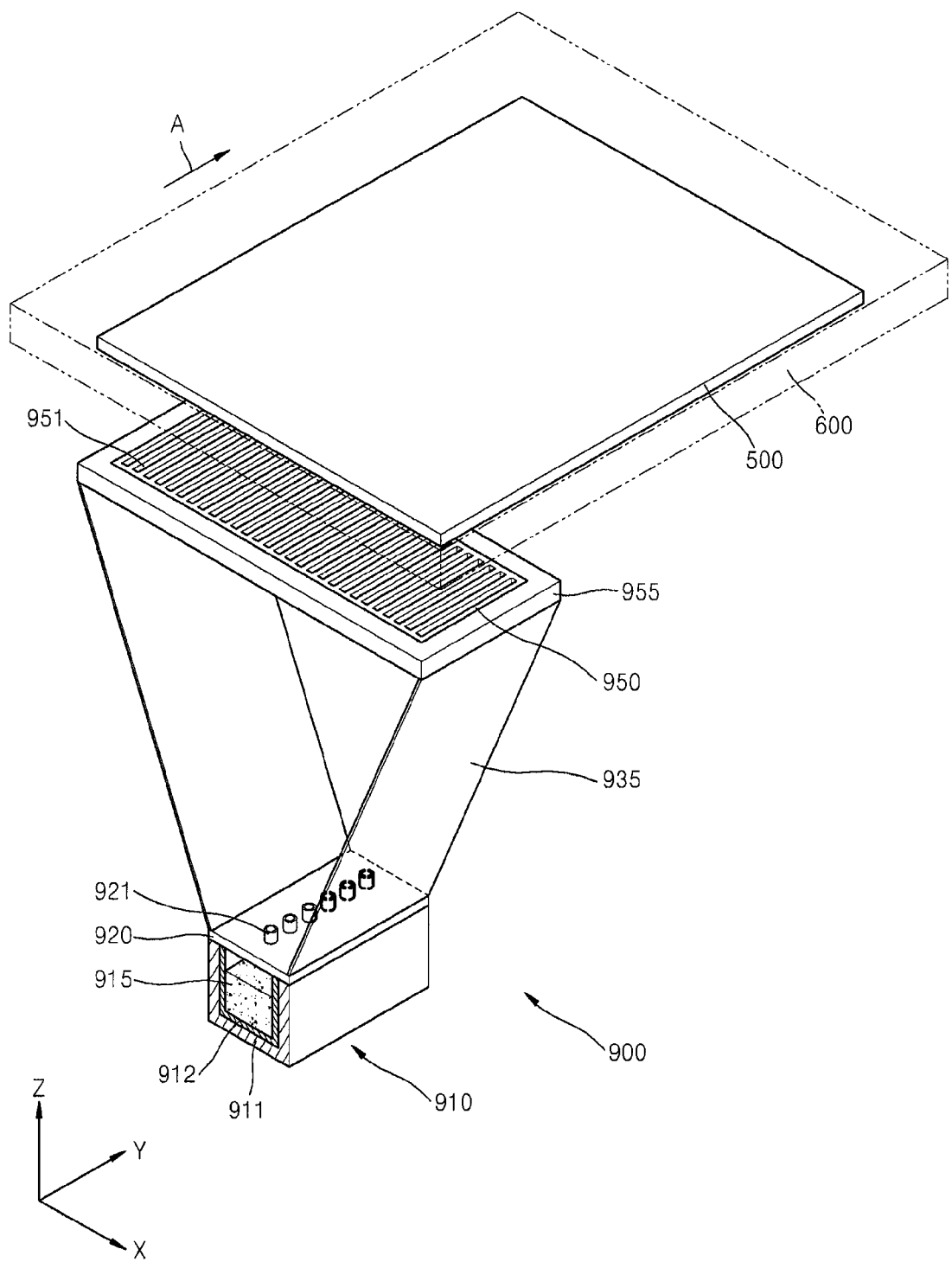
FIG. 9 is a schematic perspective view of a thin film deposition assembly according to another embodiment of the present invention.

FIG. 9 is a schematic perspective view of a thin film deposition assembly 900 according to another embodiment of the present invention. Referring to FIG. 9, the thin film deposition assembly 900 includes a deposition source 910, a deposition source nozzle unit 920, and a patterning slit sheet 950.

Although a chamber is not illustrated in FIG. 9 for the convenience of explanation, all the components of the thin film deposition assembly 900 may be disposed within a chamber that may be maintained at an appropriate degree of vacuum. The chamber may be maintained at an appropriate degree of vacuum in order to allow a deposition material 915 to move in a substantially straight line through the thin film deposition assembly 900.

In the chamber, a substrate 500, which may be a deposition target substrate, may be transferred by an electrostatic chuck 600. The substrate 500 may be a substrate for flat panel displays. A large substrate, such as a mother glass, for manufacturing a plurality of flat panel displays, may be used as the substrate 900. Other substrates may also be employed.

In the current embodiment, deposition may be performed while the substrate 500 may be moved relative to the thin film deposition assembly 900. In particular, deposition may be continuously performed while the substrate 500, which may be disposed so as to face the thin film deposition assembly 900, may be moved in a Y-axis direction. In other words, deposition may be performed in a scanning manner while the substrate 500 may be moved in a direction of arrow A in FIG. 9. Although the substrate 500 is illustrated as being moved in the Y-axis direction in FIG. 9 when deposition is performed, aspects of the present invention are not limited thereto. For example, deposition may be performed while the thin film deposition assembly 900 may be moved in the Y-axis direction, whereas the substrate 500 may be fixed. In other embodiments, both the thin film deposition assembly 900 and the substrate 500 may be moved relative to each other.

Thus, in the thin film deposition assembly 900, the patterning slit sheet 950 may be significantly smaller than a FMM used in a conventional deposition method. In other words, in the thin film deposition assembly 900, deposition may be continuously performed, i.e., in a scanning manner while the substrate 500 may be moved in the Y-axis direction. Thus, lengths of the patterning slit sheet 150 in the X-axis and Y-axis directions may be significantly less than the lengths of the substrate 400 in the X-axis and Y-axis directions. As described above, since the patterning slit sheet 950 may be formed to be significantly smaller than the FMM used in the conventional deposition method, it is relatively easy to manufacture the patterning slit sheet 950. In other words, using the patterning slit sheet 950, which is smaller than the FMM used in the conventional deposition method, is more convenient in all processes, including etching and other subsequent processes, such as precise extension, welding, moving, and cleaning processes, compared to the conventional deposition method using the larger FMM. This is more advantageous for a relatively large display device.

In order to perform deposition while the thin film deposition assembly 900 or the substrate 500 may be moved relative to the other as described above, the thin film deposition assembly 900 and the substrate 500 may be separated from each other by a distance (e.g., by a predetermined distance). This will be described later in detail.

The deposition source 910 that contains and heats the deposition material 915 may be disposed at an opposite side of the chamber to a side at which the substrate 500 may be disposed. While in a vaporized state in the deposition source 910, the deposition material 115 may be deposited on the substrate 500.

In particular, the deposition source 910 includes a crucible 911 that may be filled with the deposition material 915, and a heater 912 that heats the crucible 911 to vaporize the deposition material 915 contained in the crucible 911 towards a side of the crucible 912, and in particular, towards the deposition source nozzle unit 920.

The deposition source nozzle unit 920 may be disposed at a side of the deposition source 910, and in particular, at the side of the deposition source 910 facing the substrate 500. The deposition source nozzle unit 920 includes a plurality of deposition source nozzles 921 that may be arranged at equal intervals in the Y-axis direction, i.e., a scanning direction of the substrate 500. The deposition material 915 that may be vaporized in the deposition source 910, passes through the deposition source nozzle unit 920 towards the substrate 500. As described above, when the deposition source nozzle unit 920 includes the plurality of deposition source nozzles 921 arranged in the Y-axis direction, that is, the scanning direction of the substrate 500, the size of a pattern formed of the deposition material 915 discharged through each of a plurality of patterning slits 951 of the patterning slit sheet 950 may be affected by the size of one of the deposition source nozzles 921 (since there is only one line of the deposition nozzles 921 in the X-axis direction). Thus, no shadow zone may be formed on the substrate 500. In addition, since the plurality of deposition source nozzles 921 are arranged in the scanning direction of the substrate 500, even if there is a difference in flux between the deposition source nozzles 921, the difference may be compensated for and deposition uniformity may be maintained to be constant (or substantially constant).

The patterning slit sheet 950 and a frame 955 are disposed between the deposition source 910 and the substrate 500. The frame 955 may be formed in a lattice shape, similar to a window frame. The patterning slit sheet 950 may be bound inside the frame 955. The patterning slit sheet 950 includes the plurality of patterning slits 951 arranged in the X-axis direction. In some embodiments, at least some of the plurality of patterning slits 951 may have different lengths from one another. By varying the lengths of the patterning slits 951, for example, layers having different thicknesses may be formed concurrently. The deposition material 915 that may be vaporized in the deposition source 910, passes through the deposition source nozzle unit 920 and the patterning slit sheet 950 towards the substrate 500. The patterning slit sheet 950 may be manufactured by etching, which may be the same method as used in a conventional method of manufacturing an FMM, and in particular, a striped FMM. In this regard, the total number of the patterning slits 951 may be greater than the total number of the deposition source nozzles 921.

In addition, the deposition source 910 and the deposition source nozzle unit 920 coupled to the deposition source 910 may be disposed to be separated from the patterning slit sheet 950 by a distance (e.g., a predetermined distance). Alternatively, the deposition source 110 and the deposition source nozzle unit 920 coupled to the deposition source 110 may be connected to the patterning slit sheet 950 by connection units 935. That is, the deposition source 910, the deposition source nozzle unit 920, and the patterning slit sheet 950 may be integrally formed as one body by being connected to each other via the connection units 935. The connection units 935 may guide the deposition material 915, which may be discharged through the deposition source nozzles 921, to move straight, and not to flow in the X-axis direction. In FIG. 9, the connection members 935 are formed on left and right sides of the deposition source 910, the deposition source nozzle unit 920, and the patterning slit sheet 950 to guide the deposition material 915 not to flow in the X-axis direction; however, aspects of the present invention are not limited thereto. That is, the connection members 935 may be formed in the form of a sealed box to guide flow of the deposition material 915 both in the X-axis and Y-axis directions.

As described above, the thin film deposition assembly 900 according to the current embodiment performs deposition while being moved relative to the substrate 500. In order to move the thin film deposition assembly 900 relative to the substrate 500, the patterning slit sheet 950 is separated from the substrate 500 by a predetermined distance.

In particular, in a conventional deposition method using a FMM, deposition may be performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition assembly 900 according to the current embodiment, the patterning slit sheet 950 may be disposed to be separated from the substrate 500 by a predetermined distance.

As described above, according to the present invention, a mask may be formed to be smaller than a substrate, and deposition may be performed while the mask is moved relative to the substrate. Thus, the mask can be easily manufactured. In addition, defects caused due to the contact between a substrate and a FMM, which occur in the conventional deposition method, may be prevented. Furthermore, since it is unnecessary to dispose the FMM in close contact with the substrate during a deposition process, the manufacturing time may be reduced.

According to another embodiment of the present invention, in the thin film deposition assembly 900, a capacitive vacuum gauge (substantially identical to the capacitive vacuum gauge 170 or 170' shown in FIG. 6 or FIG. 7) may further be installed at a side of a deposition source so as to measure pressure inside the deposition source 910 and control an evaporation rate of the deposition material 915. The structure and operation of the capacitive vacuum gauges 170 and 170' are as described above with reference to FIG. 6 or 7.

Figure 10:
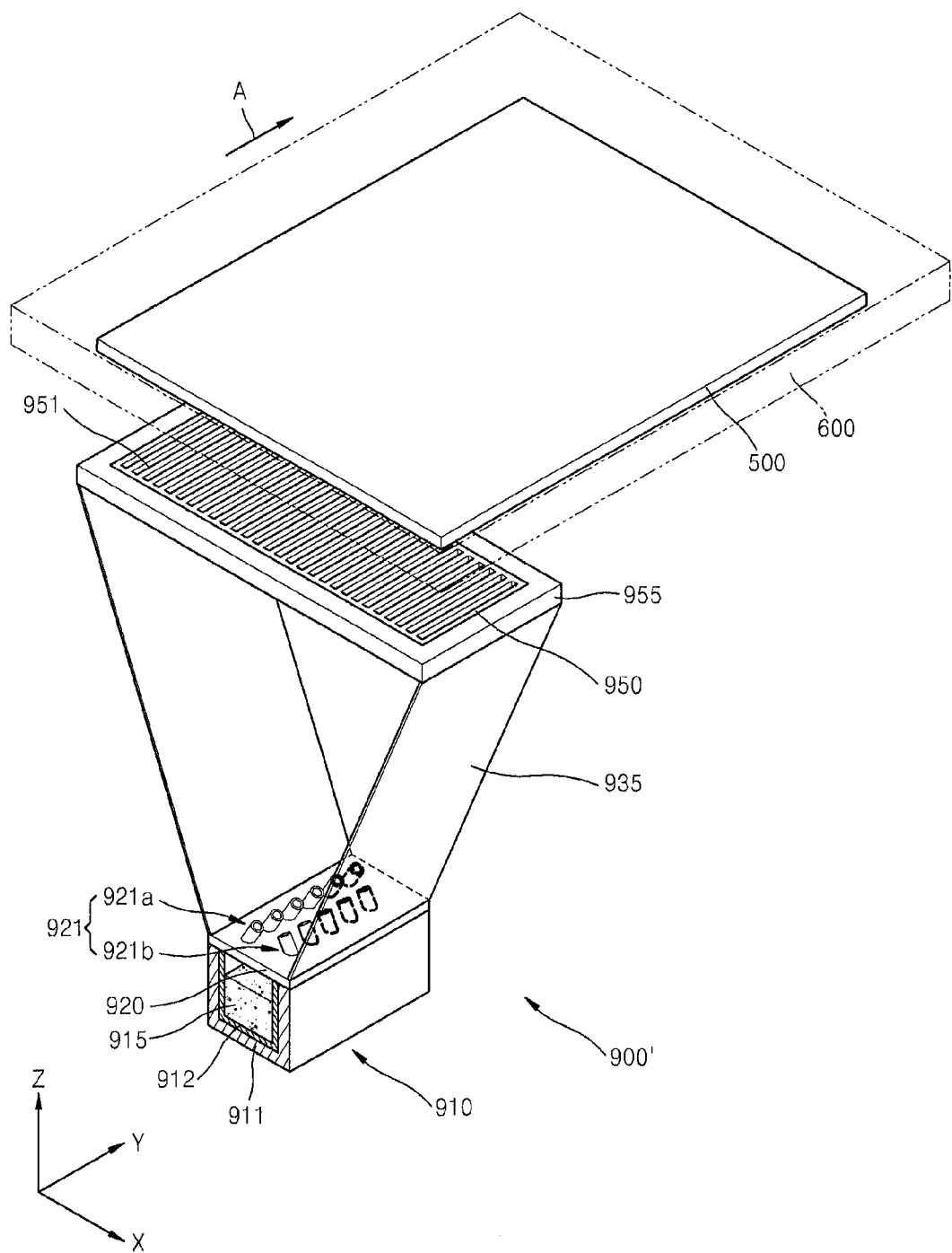
FIG. 10 is a schematic perspective view of a thin film deposition assembly according to another embodiment of the present invention.

FIG. 10 is a schematic perspective view of a thin film deposition assembly 900' according to another embodiment of the present invention. Referring to FIG. 10, the thin film deposition assembly 900' includes a deposition source 910, a deposition source nozzle unit 920, and a patterning slit sheet 950. The deposition source 910 includes a crucible 911 that may be filled with a deposition material 915, and a heater 912 that heats the crucible 911 to vaporize the deposition material 915, which may be contained in the crucible 911, toward the deposition source nozzle unit 920. The deposition source nozzle unit 920, which has a planar shape, may be disposed at a side of the deposition source 910. The deposition source nozzle unit 920 includes a plurality of deposition source nozzles 921 arranged in the Y-axis direction. The patterning slit sheet 950 and a frame 955 are further disposed between the deposition source 910 and a substrate 500. The patterning slit sheet 950 has a plurality of patterning slits 951 arranged in the X-axis direction. In some embodiments, at least some of the plurality of patterning slits 951 may have different lengths from one another. By varying the lengths of the patterning slits 951, for example, layers having different thicknesses may be formed concurrently. In addition, the deposition source 910 and the deposition source nozzle unit 920 may be connected to the patterning slit sheet 950 by connection units 935.

In the current embodiment, the plurality of deposition source nozzles 921 formed in the deposition source nozzle unit 920 are tilted at an angle (e.g., at a predetermined angle), unlike the above previous embodiments. In particular, the deposition source nozzles 921 may include deposition source nozzles 921*a* and 921*b* arranged in respective rows. The deposition source nozzles 921*a* and 921*b* may be arranged in respective rows to alternate in a zigzag pattern. The deposition source nozzles 921*a* and 921*b* may be tilted at a predetermined angle with respect to an XZ plane.

That is, in the current embodiment, the deposition source nozzles 921*a* and 921*b* are arranged to tilt at an angle (e.g., a predetermined angle) to each other. The deposition source nozzles 921*a* of a first row and the deposition source nozzles 921*b* of a second row may tilt to face each other. That is, the deposition source nozzles 921*a* of the first row in a left part of the deposition source nozzle unit 920 may tilt to face a right side portion of the patterning slit sheet 950, and the deposition source nozzles 921*b* of the second row in a right part of the deposition source nozzle unit 920 may tilt to face a left side portion of the patterning slit sheet 950.

Figure 11:
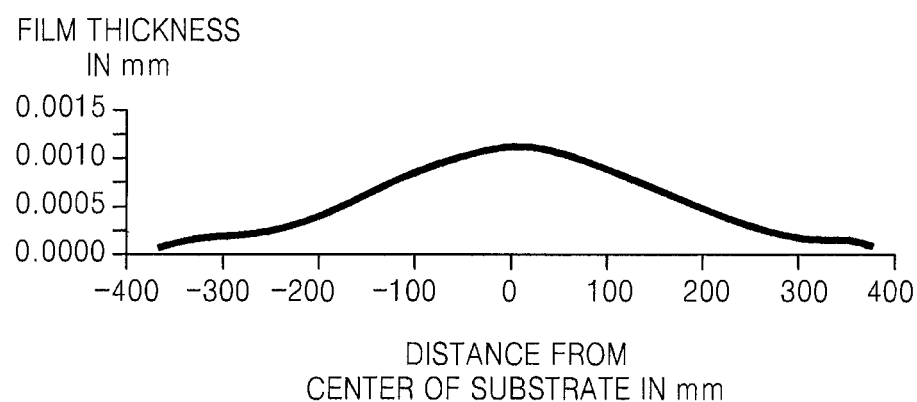
FIG. 11 is a graph schematically illustrating a distribution pattern of a deposition material deposited on a substrate when deposition source nozzles are not tilted in a thin film deposition assembly according to an embodiment of the present invention.
Figure 12:
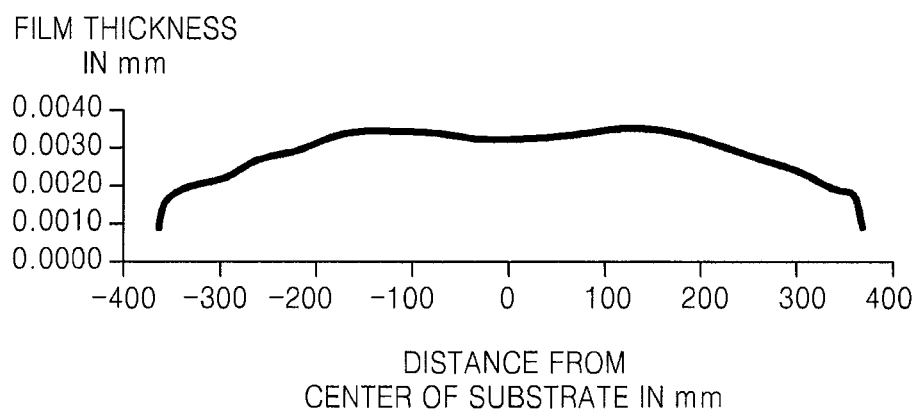
FIG. 12 is a graph schematically illustrating a distribution pattern of a deposition material deposited on a substrate when deposition source nozzles are tilted in a thin film deposition assembly according to an embodiment of the present invention.

FIG. 11 is a graph schematically illustrating a distribution pattern of a deposition material deposited on a substrate when deposition source nozzles are not tilted in a thin film deposition assembly according to an embodiment of the present invention. FIG. 12 is a graph showing a distribution pattern of a deposition material deposited on a substrate when deposition source nozzles are tilted in a thin film deposition assembly according to an embodiment of the present invention. Comparing the graphs of FIGS. 11 and 12 with each other, the thickness of the deposition material deposited on opposite end portions of the substrate when the deposition source nozzles are tilted, may be relatively greater than when the deposition source nozzles are not tilted, thereby improving deposition uniformity.

Accordingly, a deposition rate of the deposition material may be adjusted to lessen the difference between thicknesses of thin films on center and end portions of the substrate, thereby improving thickness uniformity. Moreover, utilization efficiency of the deposition material may also be improved.

In a thin film deposition assembly according to another embodiment of the present invention, a capacitive vacuum gauge (e.g., the capacitive vacuum gauge 170 of FIG. 6 or the capacitive vacuum gauge 170' of FIG. 7) may be installed at a side of a deposition source so as to measure pressure inside the deposition source and control an evaporation rate of a deposition material. The structure and operation of the capacitive vacuum gauges 170 and 170' has been described above with reference to FIG. 6 or 7 and thus will not be described again here.

Figure 13:
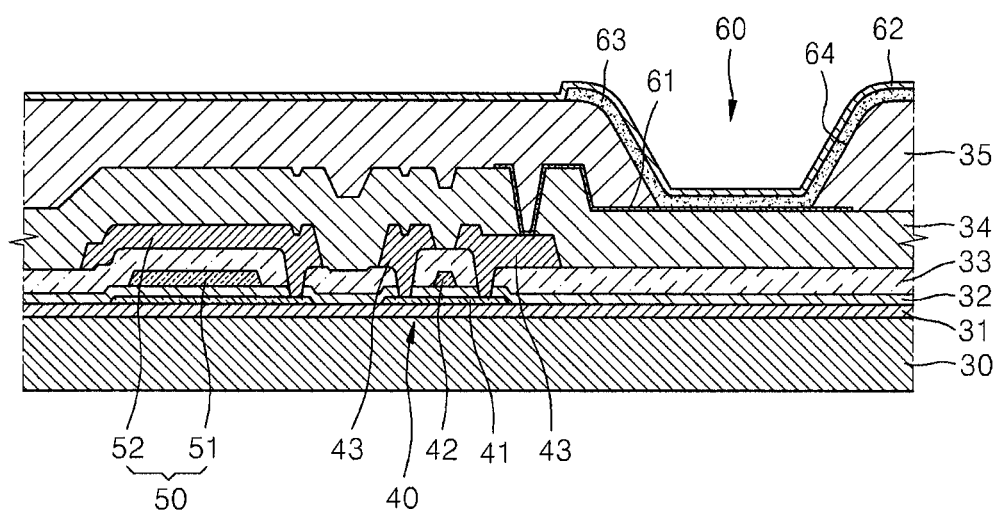
FIG. 13 is a cross-sectional view of an active matrix organic light-emitting display device fabricated by using a thin film deposition apparatus, according to an embodiment of the present invention.

FIG. 13 is a cross-sectional view of an active matrix organic light-emitting display device fabricated by using a thin film deposition apparatus, according to an embodiment of the present invention. Referring to FIG. 13, the active matrix organic light-emitting display device is formed on a substrate 30. The substrate 30 may be formed of a transparent material, for example, glass, plastic, or metal. An insulating layer 31, such as a buffer layer, may be formed on an entire surface of the substrate 30.

Referring to FIG. 13, a thin film transistor (TFT) 40, a capacitor 50, and an organic light-emitting diode (OLED) 60 are disposed on the insulating layer 31.

A semiconductor active layer 41 may be formed in a pattern (e.g., in a predetermined pattern) on the insulating layer 31. A gate insulating layer 32 may be formed to cover the semiconductor active layer 41. The semiconductor active layer 41 may include a p-type or n-type semiconductor material.

A gate electrode 42 of the TFT 40 may be formed in a region of the gate insulating layer 32 corresponding to the semiconductor active layer 41. An interlayer insulating layer 33 may be formed to cover the gate electrode 42. The interlayer insulating layer 33 and the gate insulating layer 32 may be etched by, for example, dry etching, to form a contact hole for exposing parts of the semiconductor active layer 41.

A source/drain electrode 43 may be formed on the interlayer insulating layer 33 to contact the semiconductor active layer 41 exposed through the contact hole. A passivation layer 34 may be formed to cover the source/drain electrode 43, and may be etched to expose a part of the drain electrode 43. An insulating layer (not shown) may be further formed on the passivation layer 34 so as to planarize the passivation layer 34.

In addition, the OLED 60 displays predetermined image information by emitting red, green, or blue light as current flows therethrough. The OLED 60 includes a first electrode 61 disposed on the passivation layer 34. The first electrode 61 is electrically connected to the drain electrode 43 of the TFT 40.

A pixel defining layer 35 may be formed to cover the first electrode 61. An opening 64 may be formed in the pixel defining layer 35, and an organic emission layer 63 may be formed in a region defined by the opening 64. A second electrode 62 may be formed on the organic emission layer 63.

The pixel defining layer 35, which defines individual pixels, may be formed of an organic material. The pixel defining layer 35 also planarizes the surface of a region of the substrate 30 in which the first electrode 61 may be formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. If the low-molecular weight organic material is used, then the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. Such a low-molecular weight organic material may be deposited using vacuum deposition by using one of the thin film deposition apparatus of FIG. 1 or FIG. 2.

After the organic emission layer 63 is formed, the second electrode 62 may be formed by the same deposition method as used to form the organic emission layer 63.

The first electrode 61 may function as an anode, and the second electrode 62 may function as a cathode, or vice versa. The first electrode 61 may be patterned to correspond to individual pixel regions, and the second electrode 62 may be formed to cover all the pixels.

The first electrode 61 may be formed as a transparent electrode or a reflective electrode. The transparent electrode may be formed of an indium tin oxide (ITO), an indium zinc oxide (IZO), a zinc oxide (ZnO), or an indium oxide ($In_2O_3$). The reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and then forming a layer of an ITO, an IZO, a ZnO, or an $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, the transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic emission layer 63 and forming an auxiliary electrode layer or a bus electrode line thereon from ITO, IZO, ZnO, $In_2O_3$, or the like. When the second electrode layer 62 is formed as a reflective electrode, the reflective layer may be formed by depositing Li, Ca, LiF/Ca, LiF/Al, Al, Ag, Mg, or a compound thereof on the organic layer 63. The second electrode 62 may be formed by using the same deposition method as used to form the organic emission layer 63 described above.

A thin film deposition apparatus according to the embodiments described above may be applied to form an organic layer or an inorganic layer of an organic TFT, and to form layers from various materials. Any of the thin film deposition assemblies 100 (FIGS. 4-6), 100' (FIG. 7), 100" (FIG. 8), 900 (FIG. 9) and 900' (FIG. 10) may be used as one or more of the thin film deposition assemblies 100, 200, 300 and 400 of FIGS. 1 and 2.

As described above, a thin film deposition apparatus according to embodiments of the present invention is suitable for manufacturing large-sized display devices on a mass scale and can be used for high-definition patterning. The thin film deposition apparatus according to embodiments of the present invention also may be used to manufacture an organic light-emitting display device.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing a display device, the method comprising:
    disposing a thin film deposition apparatus apart from a substrate, which is a deposition target substrate and is fixedly supported by a chuck; and
    performing deposition on the substrate while the thin film deposition apparatus and the substrate are moved relative to each other,
    wherein the thin film deposition apparatus comprises:
        a deposition source discharging a deposition material;
        a deposition source nozzle unit disposed at a side of the deposition source and including a plurality of deposition source nozzles arranged in a first direction;
        a patterning slit sheet disposed opposite to the deposition source nozzle unit and including a plurality of patterning slits arranged in a second direction perpendicular to the first direction; and
        a capacitive vacuum gauge disposed at a side of the deposition source and measuring pressure inside the deposition source,
    wherein deposition is performed while the substrate is moved relative to the thin film deposition apparatus in the first direction, and
    wherein the capacitive vacuum gauge comprises:
        a housing;
        a first vacuum tube connecting the housing to the deposition source;
        a diaphragm disposed in the housing, and dividing the inside of the housing into two parts; and
        an electrode assembly configured to induce a capacitance according to a distance between the electrode assembly and the diaphragm.

2. The method of claim 1, wherein the diaphragm is moved toward or away from the deposition source, according to a pressure of air exhausted or supplied via the first vacuum tube.

3. The method of claim 1, wherein the capacitive vacuum gauge is configured to measure an absolute pressure inside the deposition source.

4. The method of claim 1, wherein the capacitive vacuum gauge further comprises:
    a second vacuum tube disposed at a side of one part of the housing that is not connected to the first vacuum tube, wherein the housing is divided into two parts by the diaphragm.

5. The method of claim 4, wherein the capacitive vacuum gauge is configured to measure a difference between a pressure inside the deposition source, and a pressure inside a chamber in which the thin film deposition apparatus is disposed.

* * * * *